(12) United States Patent
Malhan et al.

(10) Patent No.: US 7,557,434 B2
(45) Date of Patent: Jul. 7, 2009

(54) POWER ELECTRONIC PACKAGE HAVING TWO SUBSTRATES WITH MULTIPLE ELECTRONIC COMPONENTS

(75) Inventors: Rajesh Kumar Malhan, Kariya (JP); C. Mark Johnson, Sheffield (GB); Jeremy Rashid, Cambridge (GB)

(73) Assignees: DENSO CORPORATION, Kariya (JP); University of Cambridge, Cambridge (GB); The University of Sheffield, Sheffield (GB)

(*) Notice: Subject to any disclaimer, the term of this patent is extended or adjusted under 35 U.S.C. 154(b) by 53 days.

(21) Appl. No.: 11/511,517

(22) Filed: Aug. 29, 2006

(65) Prior Publication Data

US 2008/0054425 A1 Mar. 6, 2008

(51) Int. Cl.
H01L 23/02 (2006.01)

(52) U.S. Cl. .............. 257/678; 257/723; 257/724; 257/725

(58) Field of Classification Search ......... 257/723–725, 257/678; 361/700
See application file for complete search history.

(56) References Cited

U.S. PATENT DOCUMENTS

| | | | |
|---|---|---|---|
| 5,001,548 A * | 3/1991 | Iversen | 257/714 |
| 6,072,240 A | 6/2000 | Kimura et al. | |
| 6,324,072 B1 | 11/2001 | Lorenz et al. | |
| 6,448,645 B1 * | 9/2002 | Kimura et al. | 257/735 |
| 6,542,365 B2 | 4/2003 | Inoue | |
| 2003/0132511 A1 | 7/2003 | Gerbsch et al. | |
| 2004/0061221 A1 | 4/2004 | Schaffer | |
| 2005/0146027 A1 | 7/2005 | Kondou et al. | |
| 2005/0151161 A1 | 7/2005 | Topp et al. | |

FOREIGN PATENT DOCUMENTS

| | | |
|---|---|---|
| EP | 1 253 637 A2 | 10/2002 |
| FR | 2 786 657 A1 | 6/2000 |
| WO | WO 2004/034428 A2 | 4/2004 |

OTHER PUBLICATIONS

B. Borowy, L. Casey, G. Davis; SatCon Applied Technology & J. Connell; Advanced Thermal Technologies, *HiRel Double Sided Package For SI/SIC Power Module*; IEEE 06CH37728 44th Annual International Reliability Physics Symposium, San Jose, 2006; p. 613. [Discussed on p. 3 of the application].

German Office Action dated May 16, 2007 in the corresponding German application No. 10 2006 040 820.9-33 with English translation.

Office Action dated Oct. 10, 2008 in corresponding Chinese patent application No. 2006101288327 (and English translation).

* cited by examiner

*Primary Examiner*—N Drew Richards
*Assistant Examiner*—Swapneel Chhaya
(74) *Attorney, Agent, or Firm*—Posz Law Group, PLC

(57) ABSTRACT

A power electronic package includes: first and second high thermal conductivity insulating non-planar substrates; and a plurality of electronic components mounted on each of the substrates. The substrates are coupled each other at a plurality of bonding regions so that mechanical separation between the substrates is controlled by the number of the bonding regions, an arrangement of the bonding regions, a shape of each bonding region, and a material of the bonding regions. The mechanical separation provides a net axially-directed compressive force in the electronic components.

36 Claims, 41 Drawing Sheets

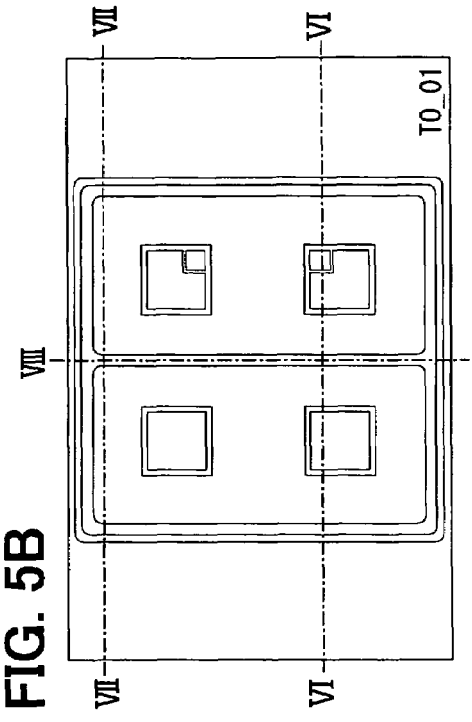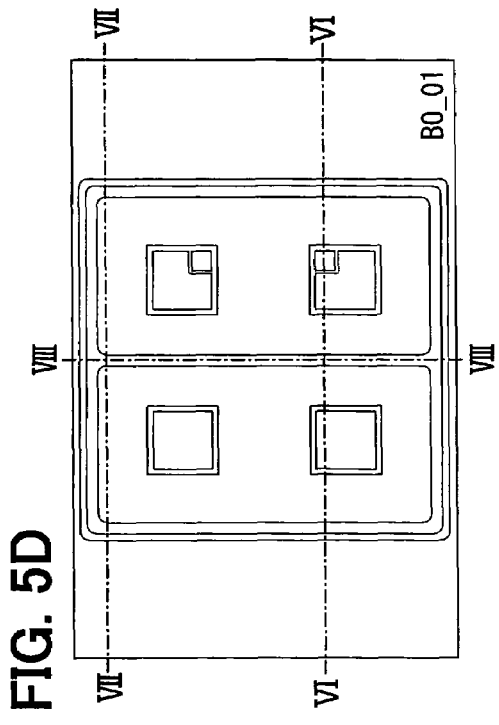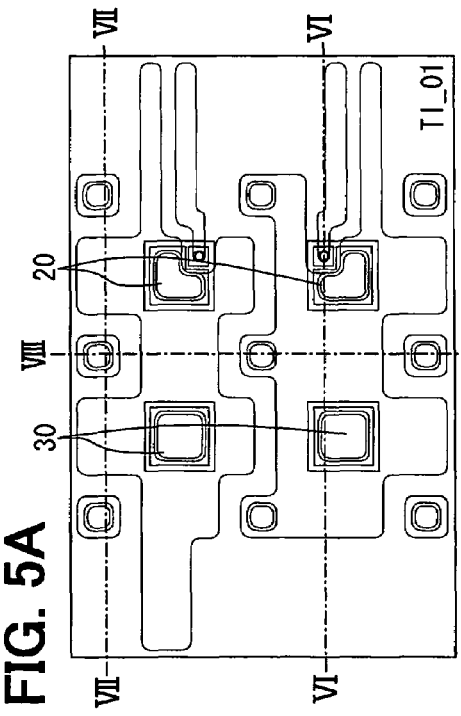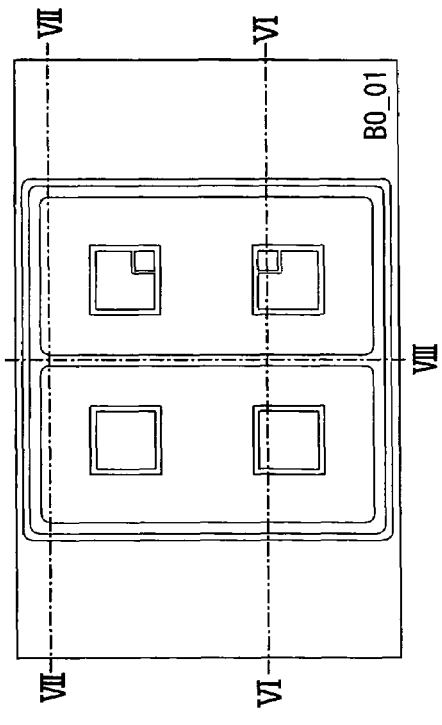

TO_01 Cu LEADS TOP DBC

TI_01 Cu LEADS TOP DBC

BI_01 Cu LEADS BTM DBC

BO_01 Cu LEADS BTM DBC

TO_01 Cu POSTS

TI_01 Cu POSTS

BI_01 Cu POSTS

BO_01 Cu POSTS

TI_01 SOLDER RESIST

BI_01 SOLDER RESIST

SOLDER RESIST
POST ATTACH (AuSn)
SiC DIE
DIE ATTACH (AuGe)
SOLDER RESIST

FIG. 46

CASE 1: CENTRAL POST, DIES EITHER SIDE

| DIE-DIE SPACING (mm) | DIE-POST EFFECTIVE SPACING | POST-DPOST EFFECTIVE SPACING | THERMAL DEFLECTION (mm) | POST LOAD (N) | POST STRESS (N/mm²) | LOAD DEFLECTION (mm) | DIE LOAD (N) | DIE STRESS (N/mm²) |
|---|---|---|---|---|---|---|---|---|
| 10 | 1.5 | 2 | 0.001566 | 3.33E+02 | 8.33E+01 | 1.09E-03 | 1.67E+02 | 6.66E+00 |
| 12 | 2.5 | 3 | 0.001566 | 1.15E+02 | 2.87E+01 | 1.40E-03 | 5.73E+01 | 2.29E+00 |
| 14 | 3.5 | 4 | 0.001566 | 4.88E+01 | 1.22E+01 | 1.50E-03 | 2.44E+01 | 9.76E-01 |
| 16 | 4.5 | 5 | 0.001566 | 2.47E+01 | 6.17E+00 | 1.53E-03 | 1.23E+01 | 4.94E-01 |
| 18 | 5.5 | 6 | 0.001566 | 1.41E+01 | 3.52E+00 | 1.55E-03 | 7.05E+00 | 2.82E-01 |
| 20 | 6.5 | 7 | 0.001566 | 8.77E+00 | 2.19E+00 | 1.55E-03 | 4.39E+00 | 1.75E-01 |
| 22 | 7.5 | 8 | 0.001566 | 5.82E+00 | 1.45E+00 | 1.56E-03 | 2.91E+00 | 1.16E-01 |
| 24 | 8.5 | 9 | 0.001566 | 4.05E+00 | 1.01E+00 | 1.56E-03 | 2.03E+00 | 8.10E-02 |
| 26 | 9.5 | 10 | 0.001566 | 2.93E+00 | 7.33E-01 | 1.56E-03 | 1.47E+00 | 5.86E-02 |
| 28 | 10.5 | 11 | 0.001566 | 2.19E+00 | 5.48E-01 | 1.56E-03 | 1.10E+00 | 4.38E-02 |
| 30 | 11.5 | 12 | 0.001566 | 1.68E+00 | 4.20E-01 | 1.56E-03 | 8.39E-01 | 3.36E-02 |

FIG. 47

| CASE 2: CENTRAL DIE, POSTS EITHER SIDE | | | | | | | | |
|---|---|---|---|---|---|---|---|---|
| POST-POST SPACING (mm) | DIE-POST EFFECTIVE SPACING | POST-DPOST EFFECTIVE SPACING | THERMAL DEFLECTION (mm) | POST LOAD (N) | POST STRESS (N/mm$^2$) | LOAD DEFLECTION (mm) | DIE LOAD (N) | DIE STRESS (N/mm$^2$) |
| 10 | 1.5 | 2 | 0.001566 | 1.91E+02 | 4.78E+01 | 1.25E-03 | 3.83E+02 | 1.53E+01 |
| 12 | 2.5 | 3 | 0.001566 | 6.00E+01 | 1.50E+01 | 1.47E-03 | 1.20E+02 | 4.80E+00 |
| 14 | 3.5 | 4 | 0.001566 | 2.49E+01 | 6.22E+00 | 1.52E-03 | 4.98E+01 | 1.99E+00 |
| 16 | 4.5 | 5 | 0.001566 | 1.25E+01 | 3.12E+00 | 1.54E-03 | 2.49E+01 | 9.97E-01 |
| 18 | 5.5 | 6 | 0.001566 | 7.09E+00 | 1.77E+00 | 1.55E-03 | 1.42E+01 | 5.67E-01 |
| 20 | 6.5 | 7 | 0.001566 | 4.40E+00 | 1.10E+00 | 1.56E-03 | 8.80E+00 | 3.52E-01 |
| 22 | 7.5 | 8 | 0.001566 | 2.91E+00 | 7.29E-01 | 1.56E-03 | 5.83E+00 | 2.33E-01 |
| 24 | 8.5 | 9 | 0.001566 | 2.03E+00 | 5.07E-01 | 1.56E-03 | 4.06E+00 | 1.62E-01 |
| 26 | 9.5 | 10 | 0.001566 | 1.47E+00 | 3.67E-01 | 1.56E-03 | 2.94E+00 | 1.17E-01 |
| 28 | 10.5 | 11 | 0.001566 | 1.10E+00 | 2.74E-01 | 1.56E-03 | 2.19E+00 | 8.77E-02 |
| 30 | 11.5 | 12 | 0.001566 | 8.40E-01 | 2.10E-01 | 1.56E-03 | 1.68E+00 | 6.72E-02 |

POWER ELECTRONIC PACKAGE HAVING TWO SUBSTRATES WITH MULTIPLE ELECTRONIC COMPONENTS

FIELD OF THE INVENTION

The present invention relates generally to a power electronic package having two substrates with multiple electronic components.

BACKGROUND OF THE INVENTION

High-performance power electronic devices continue to make great strides in voltage, current and power levels. But the higher performance comes with higher power dissipation levels that place a strain on electrical interconnections, on cooling and on mechanical integrity. Conventional approaches to packaging power electronics uses discrete packaged devices mounted onto a board or substrate or a hybrid module in which bare chips are mounted onto a substrate and connected to the substrate by wire bonds have significant performance limitations. The discrete packages can be plastic molded, metal sealed cans or sealed ceramic carriers, containing one power chip wire bonded to a plastic package lead frame. The bare power chip is solder attached to a pad on the substrate and the thermal path is through these interfaces, through the substrate, through an adhesive or thermal grease into a cooling structure. The number of thermal interfaces and the poor thermal conductance of the substrates and the interface materials causes excessively high junction-to-ambient thermal resistances, limiting device operation and increasing the junction temperature beyond limits. These thermal effects can also cause designers to move devices apart to increase thermal spreading, at the expense of a larger module size, increased electrical parasitics and a more costly assembly.

Power semiconductor chips such as power JFETs, MOSFETs, IGBTs and diodes are devices for controlling large currents, and they produce large amounts of heat. Consequently, when these semiconductor chips are built into packages, it is arranged to achieve a sufficient cooling performance (heat radiation). In a conventional power module technology, consisting of a plurality of semiconductor chips built into a package, an insulating substrate made of a high thermal conductivity ceramic is used, and the plurality of semiconductor chips are mounted on this insulating substrate, and main electrodes provided on the lower principal surfaces of the semiconductor chips are connected by soft soldering to a copper thick film provided on the insulating substrate. Main electrodes and control electrodes provided on the upper surfaces of the IGBT chips are connected to a copper thick film provided on the insulating substrate by wire bonding. The insulating substrate is soldered to a heat radiation base plate made of copper. By this means, heat produced by the semiconductor chips is radiated through the insulating substrate disposed on the lower surface side of the semiconductor chips. In this conventional technology, heat is only radiated from one surface of each of the semiconductor chips, there is a limit to how much the heat-radiation performance can be raised, and reducing the size of the construction of the power module.

An advanced packaging technology that addresses the thermal and mechanical performance requirements while providing a high electrical performance interconnect structure are required in the future for power electronics targeted at application areas such as military, aerospace, medical and industrial electronics. These application areas all are moving to semiconductors with higher voltage, higher current, higher power dissipation and faster switching speeds, and the devices are outstripping the electrical, mechanical and thermal capabilities of traditional packaging approaches. The advanced packaging technology should replace the wire-bonded die on low-performance ceramic substrates with one side cooling path with a direct double side cooled metal-based interconnect structure. One example of this construction is an electrically isolated and thermally conductive double side pre-packed component, which is disclosed in, for example, U.S. patent application publication No. 2003/0132511. In this pre-packed component, stamped lead members, contact electrodes, semiconductor chips and the like are positioned between a pair of ceramic substrate members. Another example of this construction is a high reliability copper graphite conductor substrate power device package, which is disclosed in, for example, IEEE 44th Annual International Reliability Physics Symposium, San Jose, 2006, page 613. This package has a structure wherein an IGBT and diode chips are sandwiched by two copper graphite conductor substrates, gold bumps and solder bumps for planarization and interconnection, and a second copper graphite layer for topside interconnect and double sided heat removal. However, without the inherent stress relief of wire bonds, double-sided construction requires very careful material selection to eliminate expansion mismatch at the interfaces, while providing high conductivity for both electrical and thermal conduction. The reduced Coefficient of thermal expansion of the heat transfer layer not only provides for a reliable interface, but due to the reduced stress on the electrical insulator layer allows the use of very thin AlN dielectric to further improve the heat transfer. In this configuration, to obtain electrical connection between the electrodes of the IGBT and diode chips and the electrodes, the semiconductor chips are sandwiched by two copper graphite conductor substrates, gold bumps and solder bumps for planarization. However, on the upper side of the semiconductor chip, because the electrodes on this upper side and electrodes provided on the upper insulating substrate are connected by metal bumps, the area of the connection is small. Consequently, there has been the problem that the electrical resistance is large, which is disadvantageous to obtaining large currents, and that heat produced by the semiconductor chip is not readily transmitted to the insulating substrate, and thus the heat-radiation performance is poor. Also, this package design requires external connection buses bonding together with the semiconductor chips bonding. In this asymmetric design layout, it difficult to control to achieve a uniform stress distribution in the package after the full assembly process, which may leads to large stresses on the semiconductor chips. The semiconductor chips like IGBTs and MOSFETs having MOS gate structures have the characteristic that they are vulnerable to stresses.

SUMMARY OF THE INVENTION

In view of the above-described problem, it is an object of the present disclosure to provide a power electronic package having two substrates with multiple electronic components.

According to an aspect of the present disclosure, a power electronic package includes: first and second high thermal conductivity insulating non-planar substrates; and a plurality of electronic components mounted on each of the first and second high thermal conductivity insulating non-planar substrates. The first and second high thermal conductivity insulating non-planar substrates are coupled each other at a plurality of bonding regions so that mechanical separation between the first and second high thermal conductivity insulating non-planar substrates is controlled by the number of the bonding regions, an arrangement of the bonding regions, a shape of each bonding region, and a material of the bonding regions. The mechanical separation provides a net axially-directed compressive force in the electronic components.

In the above package, a uniform stress distribution is obtained in the power electronic package, so that the stress in the electronic components is reduced. Further, heat radiation performance is improved. Furthermore, the power electronic package does not include any bond wire from the components to external pads, the number of bonding joints is reduced so that liability of the package is increased.

BRIEF DESCRIPTION OF THE DRAWINGS

The above and other objects, features and advantages of the present invention will become more apparent from the following detailed description made with reference to the accompanying drawings. In the drawings:

FIGS. 5A and 5B are top and bottom plan views with cut line marks of the upper high thermal conductivity insulating substrate, respectively, and FIGS. 5C and 5D are top and bottom plan views with cut line marks of the lower high thermal conductivity insulating substrate, respectively;

FIG. 46 is a table of summarizing the calculated results of chip-chip spacing effect on chip stress based on analytical bending model, and the model is based on linear-elastic bending of the substrate coupled with linear-elastic extension/compression of the semiconductor chips/post assemblies; and FIG. 47 is a table of summarizing the calculated results of post-post spacing effect on chip stress based on analytical bending model.

DETAILED DESCRIPTION OF THE PREFERRED EMBODIMENTS

Figure 1:
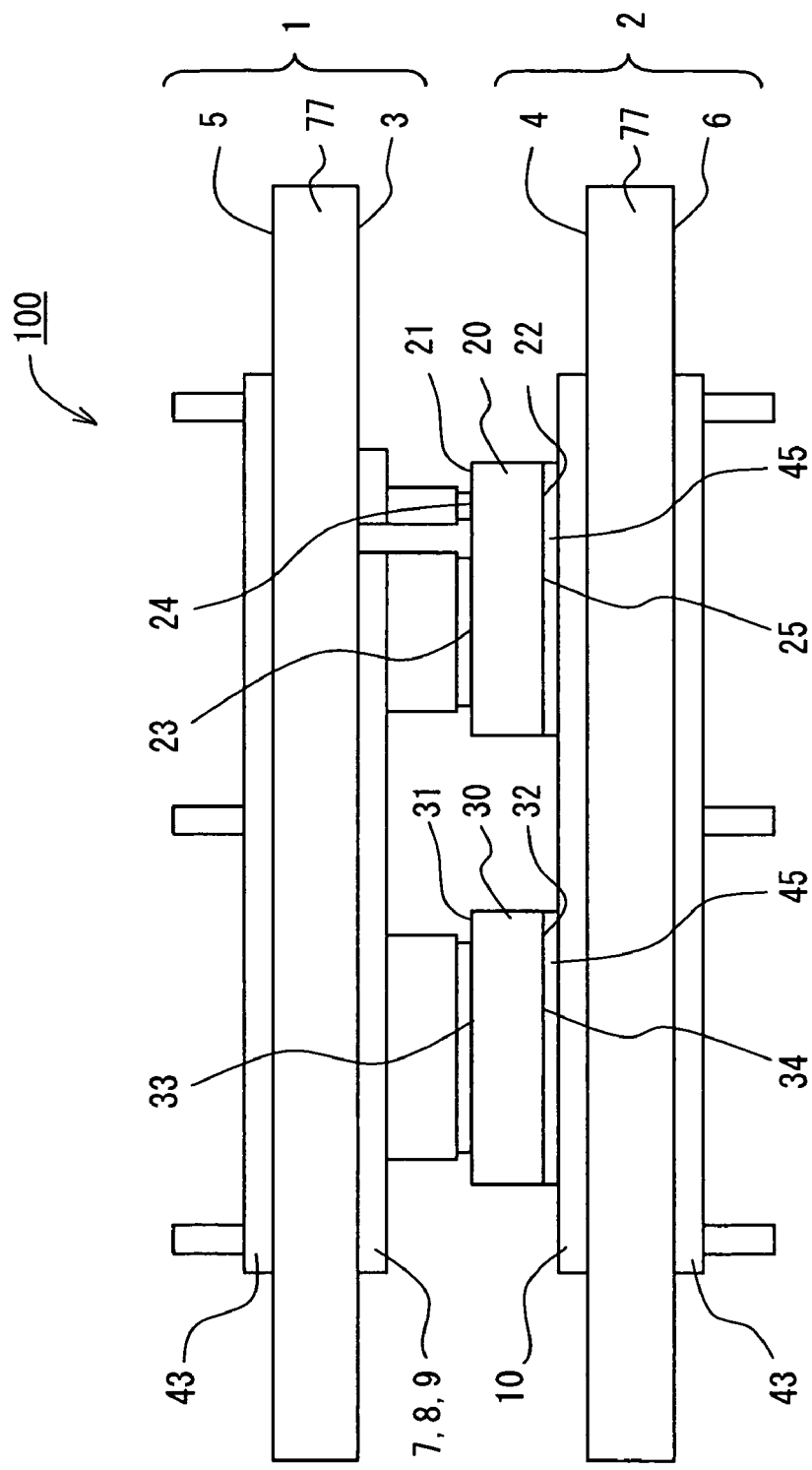
FIG. 1 is a cross-sectional view showing a power electronic package.

Referring now to the drawings in which like numerals reference like parts, preferred embodiments of a double-side cooled power electronic will be discussed.

A first example embodiment applied to a power electronic package 10 will be described with reference to FIG. 1 through FIG. 8. The cross section of the power electronic package 100 is shown in FIG. 1 (Figure shows only half of the half-bridge rectifier, i.e. one transistor 20 and one diode 30). The power electronic package 100 consists of for example two power semiconductor transistor chips 20 and for example two power semiconductor diode chips 30 sandwiched between two high thermal conductivity insulating non-planar substrates 1, 2, onto which metal electrodes 7-10 have been patterned to make contact with the semiconductor chips when the upper and lower non-planar substrates 1, 2 are brought into contact. FIGS. 2A to 3B show the upper and lower non-planar substrates layouts. Inner and outer sides for these high thermal conductivity insulating non-planar substrates 1, 2 are shown in the figures. The power semiconductor transistor chips 20 have an upper 21 and a lower surface 22 as two principal surfaces. On the lower principal surface 22 of each transistor chips 20, a drain or collector electrode 23 is formed over the entire surface. On the other upper principal surface 21 of the transistor chips 20, a small rectangular gate electrode 24 is formed in the selected region of the upper principal surface and a drain or emitter electrode 25 is formed in the remaining upper principal surface region. The power semiconductor diode chips 30 also have an upper 31 and a lower surface 32 as two principal surfaces. On the lower principal surface 32 of the power semiconductor diode chips 30, a cathode electrode 34 is formed over the entire surface. On the upper principal surface 31 of the diode chips 30 an anode electrode 33 is formed while the cathode electrode 34 is formed on the lower principal surface 32 of the diode chips 30.

Figure 4:
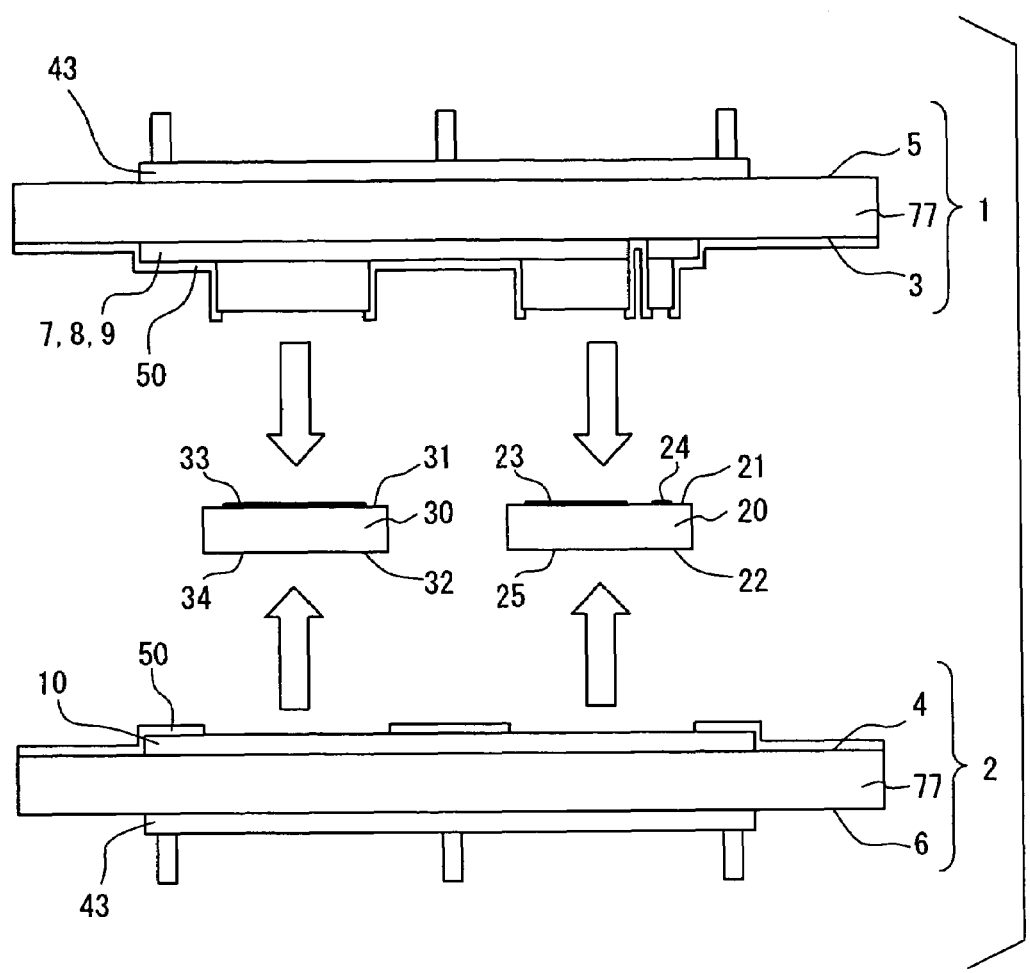
FIG. 4 is an exploded view showing the power electronic package.

In this embodiment, the power electronic package will be described with reference to FIG. 1 through FIG. 24. The upper and lower high thermal conductivity insulating substrates 1, 2 consists of a non-conductive ceramic substrate 77 and highly conductive metal 7a, 7b, 8a, 8b, 9a, 10a, 10b bonded by either direct bonded copper, directly bonded aluminum or active metal brazing solder material. The ceramic substrate is made of materials taken form the group consisting of alumina, aluminum nitride, silicon nitride, silicon carbide, or diamond, and copper or aluminum metal. The upper and lower high thermal conductivity insulating substrates 1, 2 also have an inner 3, 4 and a outer surface 5, 6 as two principal surfaces. On the inner principal surface 3 of the upper high thermal conductivity insulating substrate 1, gate, source or emitter, and anode external bus electrodes patterns 7a, 7b, 8a, 8b, 9a are disposed, as shown in a top plan view of high thermal conductivity insulating substrate in FIGS. 2 and 3. On the inner principle surface 4 of the bottom high thermal conductivity insulating substrate 2, drain and cathode external bus electrode patterns 10a, 10b are disposed. FIG. 4 show the plan view and an exploded view showing the power electronic package 100. These external bus electrodes patterns 7-10 on the high thermal conductivity insulating non-planar substrates 1, 2 are formed by either 1-bond and 2-step etching or the 2-bond and 2-step etching of copper or aluminum materials of the direct bonded copper, directly bonded aluminum or active metal brazing solder material. These external bus electrodes patterns 7a, 7b, 8a, 8b, 9a, 10a, 10b are made of the highly conductive metal.

Figure 2A:
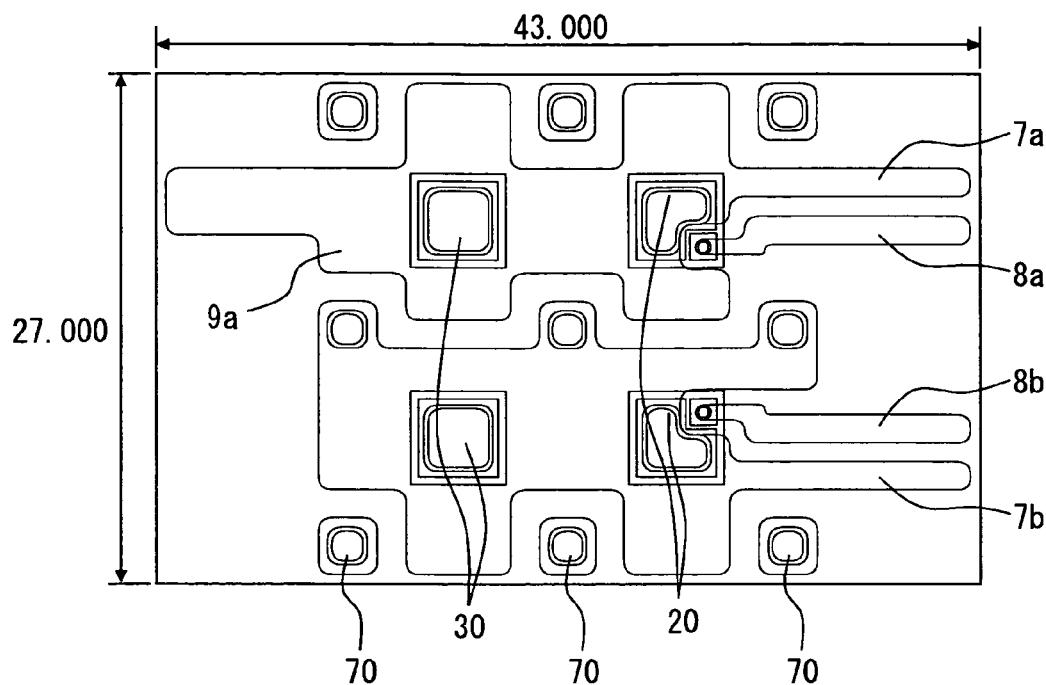
FIGS. 2A and 2B are top and bottom plan views of an upper high thermal conductivity insulating non-planar substrate, respectively.
Figure 2B:
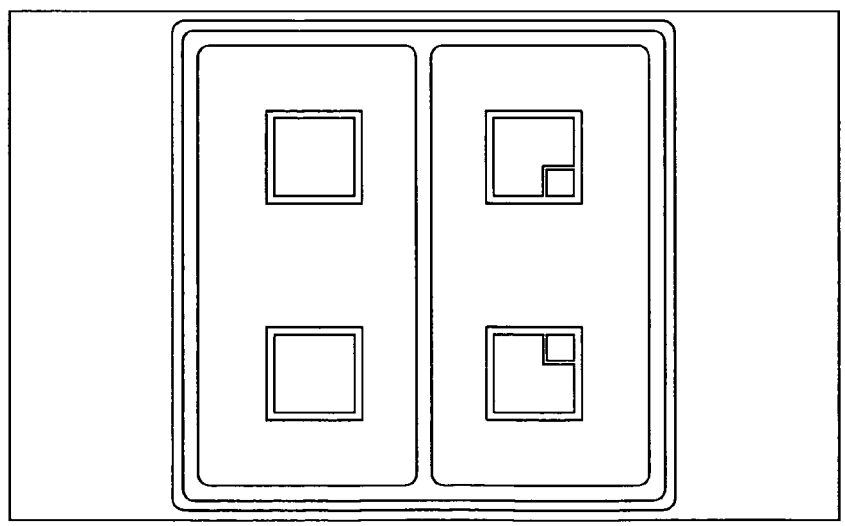
Figure 3A:
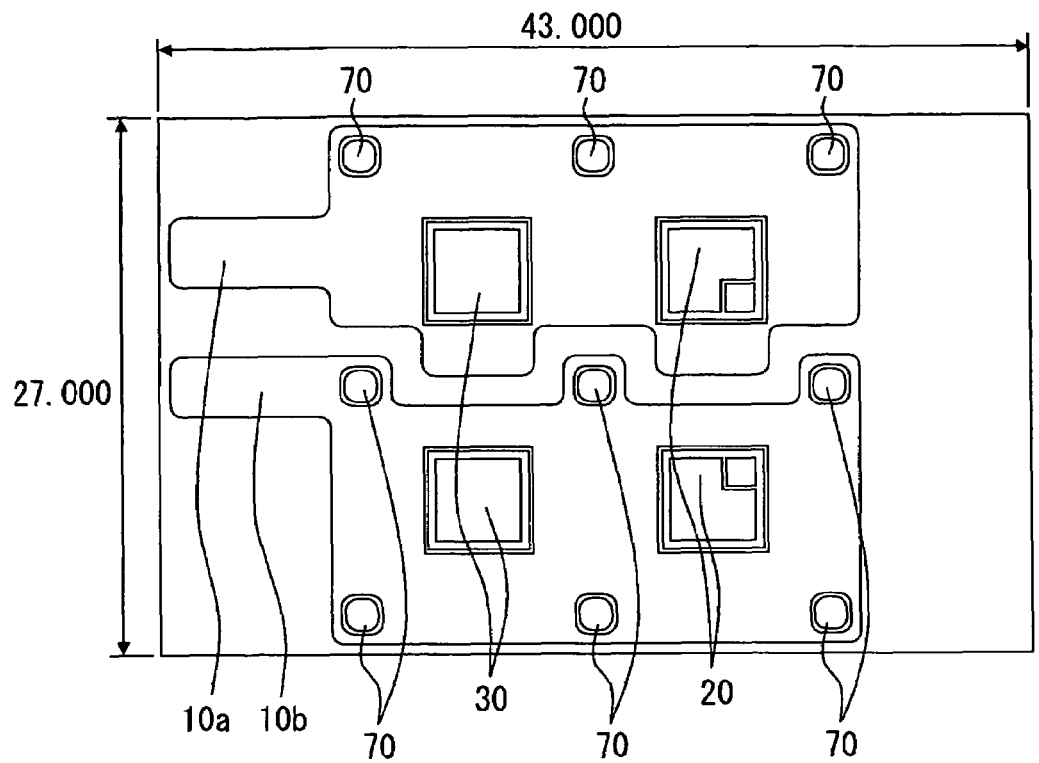
FIGS. 3A and 3B are top and bottom plan views of a lower high thermal conductivity insulating non-planar substrate, respectively.
Figure 3B:
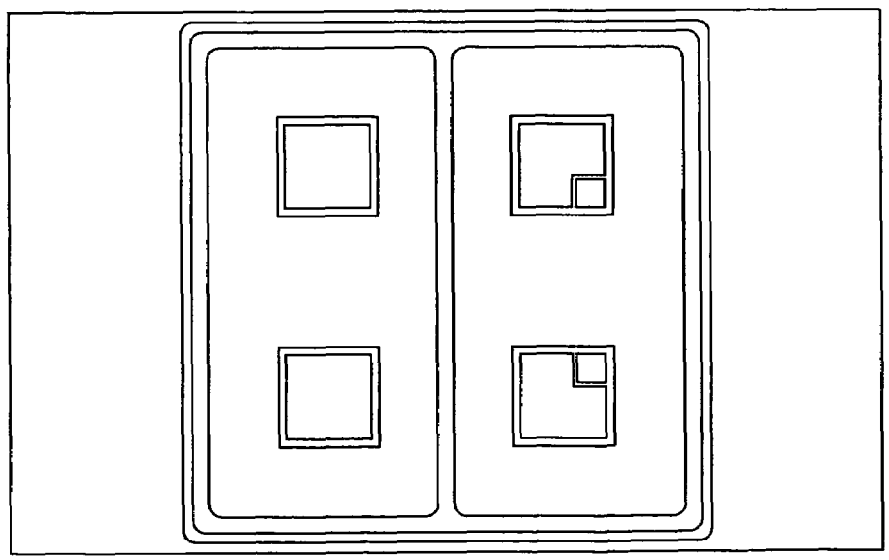

In addition to these external bus electrodes, electrically isolated regions 70 are patterned and disposed on the inner principal surfaces 3, 4 of the upper and lower high thermal conductivity insulating substrates 1, 2. These bonded regions provides defined mechanical separation of the non-planar substrates 1, 2 and also the number, placement, geometry, composition are chosen to produce a net axially-directed compressive force in the semiconductor chips after assembly. The shapes of the electrically conductive regions 7a, 7b, 8a, 8b, 9a, 10a, 10b and the isolated region 70 will now be described. As shown in FIG. 2, the upper high thermal conductivity insulating non-planar substrate 1 is made up of a substantially rectangular shape, which also includes the external connection buses. In this embodiment, for example the half bridge rectifier is designed to operate with two transistors 20 and two diodes 30. These are to be fabricated on square semiconductor chips. The distance between the semiconductor chips is a variant in this invention as it plays a big role in determining the stress distribution over the whole power electronic package 100.

FIGS. 5A to 5D shown the cut line marks on the top and bottom plan views of a upper and lower high thermal conductivity insulating substrates. The cross-sectional views along the lines VI-VI, VII-VII and VIII-VIII are shown in the FIGS. 6, 7, and 8, respectively. As shown in these figures, the upper and lower high thermal conductivity insulating non-planar substrates 1, 2 is made up of a substantially rectangular shape, which also includes the external connection buses. Two semiconductor transistor 20 and two semiconductor diode chips 30 are soldered on the lower high thermal conductivity insulating non-planar substrate 2. Moving away from the semiconductor chips bonding region on the non-planar substrates 1, 2, the external line connection terminals, which defines DC bus and phase out leads are positioned in the z direction. The patterned connection buses were on upper and lower high thermal conductivity insulating non-planar substrates 1, 2 and provide direct integration of the power electronic package 100 with external circuitry like the gate drive unit (GDU) as no external rigging is necessary to compensate for the height difference between the buses. The external line connection terminal metal 7a, 7b, 8a, 8b, 9a, 10a, 10b is confined in the upper and lower high thermal conductivity insulating non-planar substrates 1, 2 geometry and not protruding from the non-planar substrates. In the power electronic package 100, for the mechanical stability and to minimize the stress on the semiconductor chips, there are non-electrically active support posts on the periphery of the module. This is to aid with the mechanical support especially during the compression bond formation between the non-electrically active support posts and the semiconductor chips, thus preventing undue stresses from building up in the high thermal conductivity insulating non-planar substrates 1, 2. In order to prevent the support posts from floating to any potential (thus potentially reducing the effect of the device terminations which are in very close proximity these posts), they are tied to metal 10b tracks on the bottom high thermal conductivity insulating non-planar substrate, which essentially means the phase output and the positive bus. These support posts were electrically isolated from the upper high thermal conductivity insulating non-planar substrate 1, although the substrate was patterned to contribute to the overall height of these posts.

Figure 9:
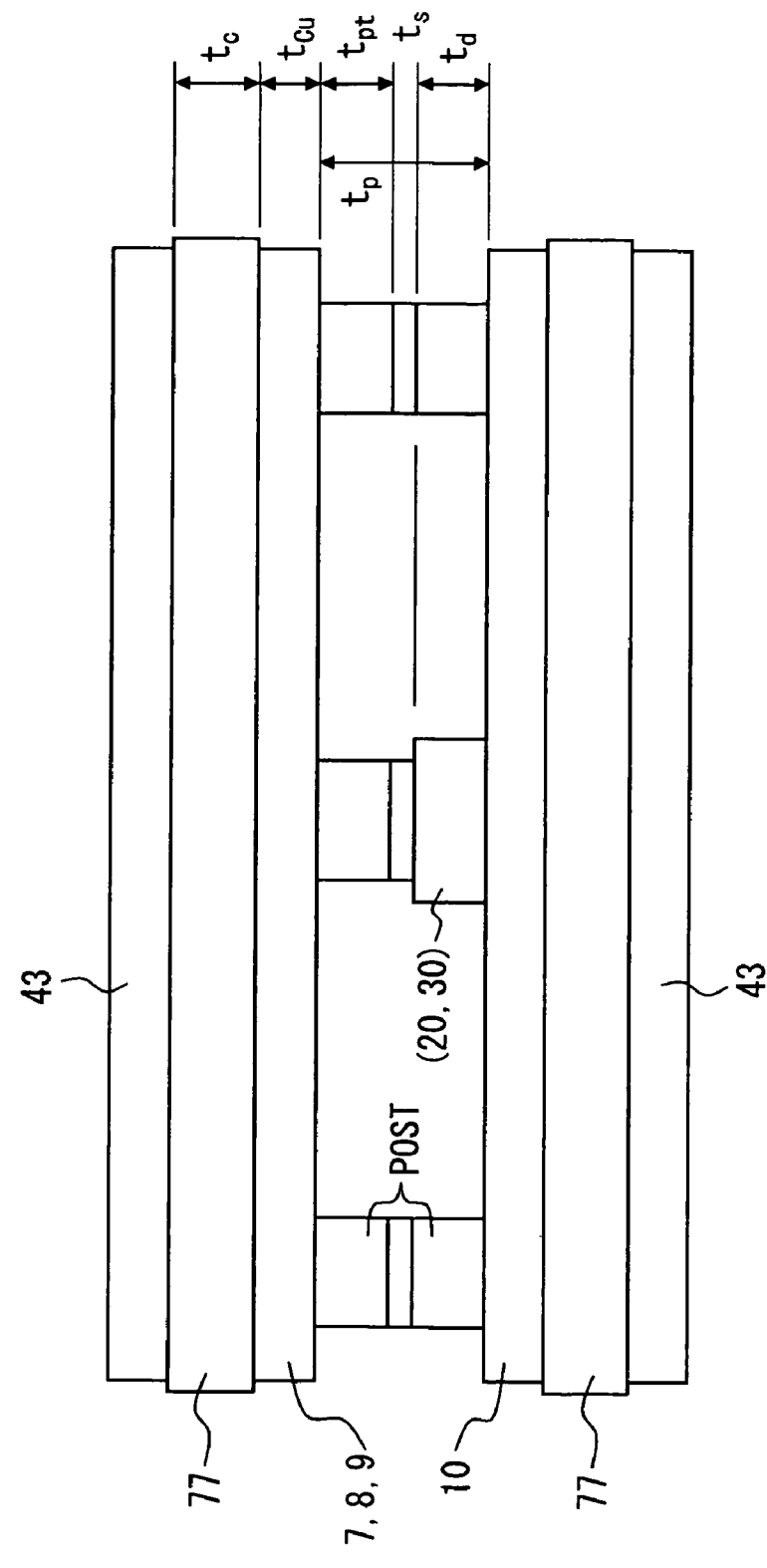
FIG. 9 is a typical cross section model concept of power semiconductor package considered for an analytical bending moment model evaluation.
Figure 10A:
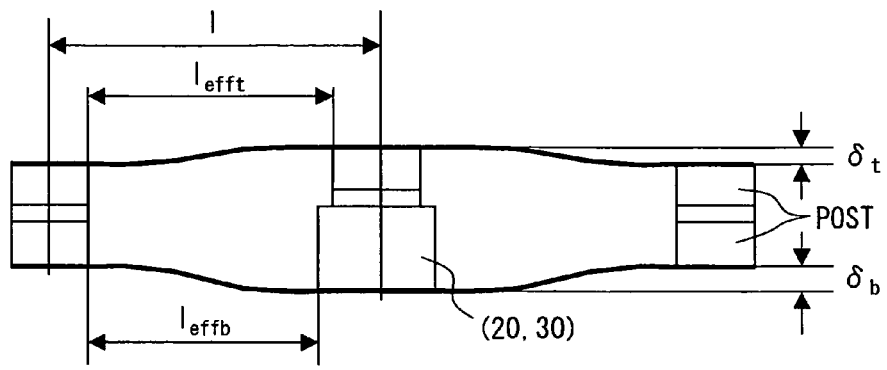
FIG. 10A to 10C are substrates modeled by beam elements, which are "built-in" at either end.

Analytical bending model analysis was done to estimate the effect of various design parameters of the power electronic package as shown in FIG. 9. The model is based on linear-elastic bending of the non-planar substrate coupled with linear-elastic extension/compression of the semiconductor chip/post assemblies driven by differential thermal expansion (contraction) of the semiconductor chip/post assemblies to simulate the build-up of residual stress following reflow. The substrate is modeled by beam elements, which are "built-in" at either end as shown in FIGS. 10A and 10C. The beam lengths are $l_{efft}$ for the top section (between the interconnect posts) and $l_{effb}$ for the bottom section (between the semiconductor chip and post). Deflections $\delta_t$ and $\delta_b$ for the upper and lower beams can be related to the vertical forces at either end as follows:

$$\delta = \frac{Fl_{eff}^3}{12EI}$$

where E is Young's modulus and I is the second moment of inertia For the composite non-planar substrate the effective EI product can be shown to be:

$$EI_{DBC} = E_1 b \left( \frac{d_1^3}{12} + \frac{E_2}{E_1} \left( \frac{2}{3} d_2^3 + d_2^2 d_1 + \frac{1}{2} d_2 d_1^2 \right) \right)$$

where $E_1$ and $E_2$ are the moduli for the copper and ceramic layers, $d_1$ is the ceramic thickness, $d_2$ is the copper thickness, and b is the non-planar substrate width.

The deflection of the center semiconductor chip and post is given by the sum of a thermal expansion component and a stress component, which results from a compressive force 2F being applied:

$$\delta_d = k_d t_d \Delta T - k_p (t_p - t_d) \Delta T - 2F \left( \frac{t_p - t_d}{A_{pd} E_p} + \frac{t_d}{A_d E_d} \right)$$

where $k_d$ and $k_p$ are the coefficient of thermal expansions (CTEs) for the semiconductor chip and the post respectively, $A_{pd}$ and $A_d$ are the cross-sectional areas of the semiconductor chip and post, $E_d$ and $E_p$ are the moduli of the semiconductor chip and post.

For the non-planar substrate interconnect posts the corresponding expression is:

$$\delta_p = -k_p t_p \Delta T + F \frac{t_p}{A_p E_p}$$

The sum of the deflections of the beams (upper and lower) must equal the difference in deflections of the center semiconductor chip/post and the outer posts:

$$\delta_d - \delta_p = \frac{Fl_{efft}^3}{12EI} + \frac{Fl_{effo}^3}{12EI}$$

$$\frac{Fl_{efft}^3}{12EI} + \frac{Fl_{effb}^3}{12EI} = (k_p - k_d) t_d \Delta T - 2F \left( \frac{t_p}{2 A_p E_p} + \frac{t_p - t_d}{A_{pd} E_p} + \frac{t_d}{A_d E_d} \right)$$

From the above we can obtain the force:

$$F = \frac{(k_p - k_d) t_d \Delta T}{\frac{l_{efft}^3}{12EI} + \frac{l_{effb}^3}{12EI} + 2 \left( \frac{t_p}{2 A_p E_p} + \frac{t_p - t_d}{A_{pd} E_p} + \frac{t_d}{A_d E_d} \right)}$$

Figure 10B:
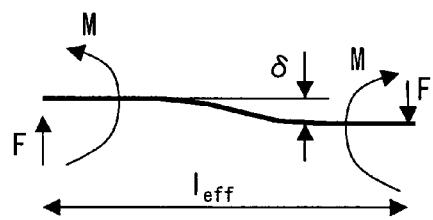
Figure 10C:
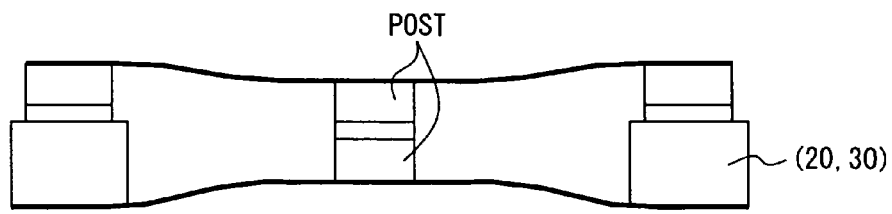
Figure 11:
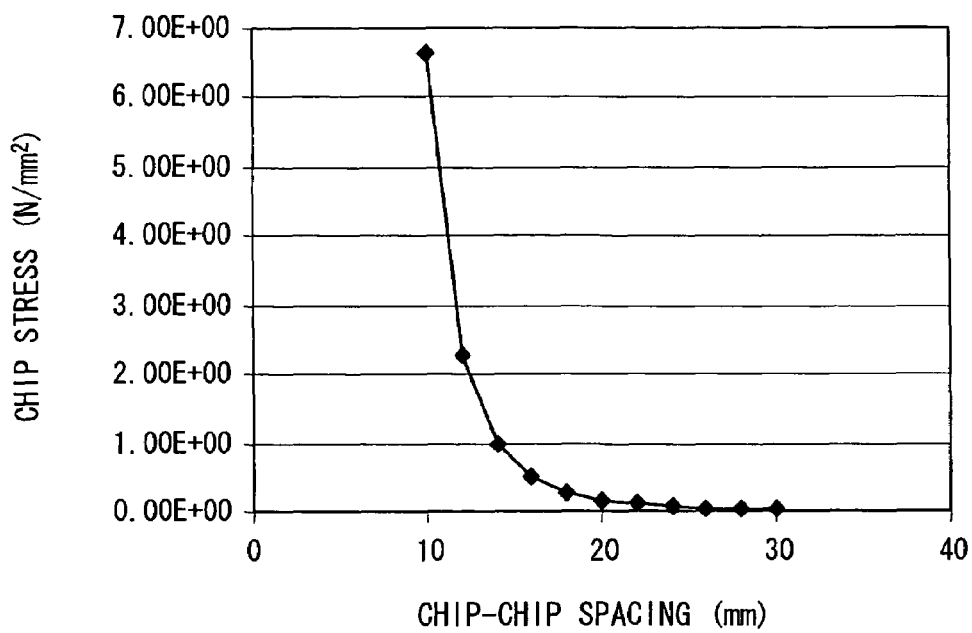
FIG. 11 is a graph showing calculated results of chip-chip spacing effect on chip stress based on analytical bending model.
Figure 12:
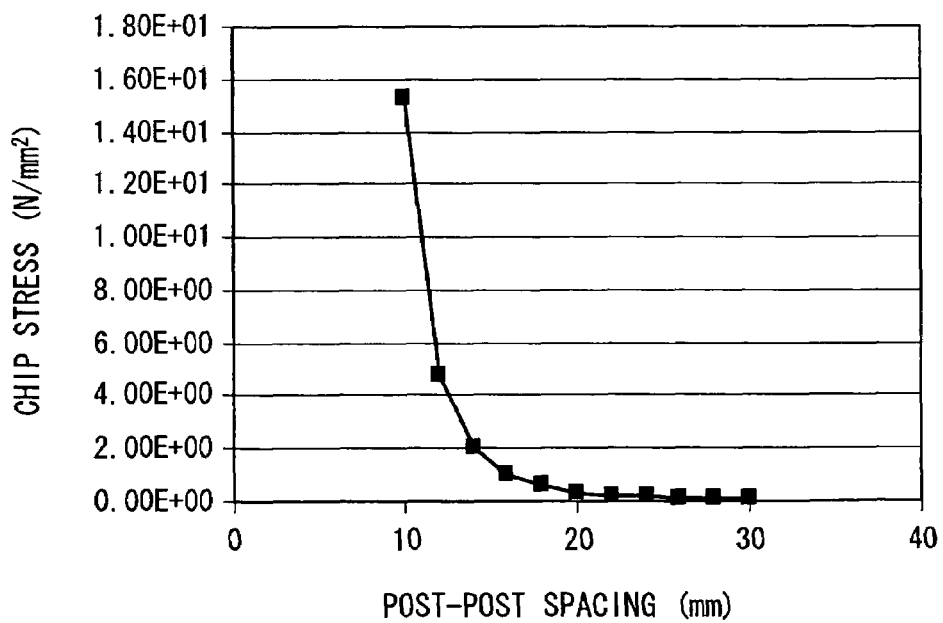
FIG. 12 is a graph showing calculated results of post-post spacing effect on chip stress based on analytical bending model.

The same method may be applied to the case where the semiconductor chips are at either end with the post in the middle of the FIG. 10. The force applied to the center post is now 2F whilst those are the semiconductor chips applied with the force F. This alters the expressions for the post deflections:

$$\delta = -k_d t_d \Delta T - k_p (t_p - t_d) \Delta T - F \left( \frac{t_p - t_d}{A_{pd} E_p} + \frac{t_d}{A_d E_d} \right)$$

$$\delta_p = -k_p t_p \Delta T + 2F \frac{t_p}{A_p E_p}$$

In this case the force F is given by:

$$F = \frac{(k_p - k_d) t_d \Delta T}{\frac{l_{efft}^3}{12EI} + \frac{l_{effb}^3}{12EI} + 2 \left( \frac{t_p}{A_p E_p} + \frac{t_p - t_d}{2 A_{pd} E_p} + \frac{t_d}{2 A_d E_d} \right)}$$

The calculated results are summarized in FIGS. 46 and 47 and FIGS. 11 and 12. Results suggest that the spacing between support posts, which ultimately determines the total stress on semiconductor chips, is carefully selected to produce a net axially-directed compressive force in the components after assembly. Spacing of semiconductor chips on the non-planar substrate is another important issue that needs consideration.

Figure 13A:
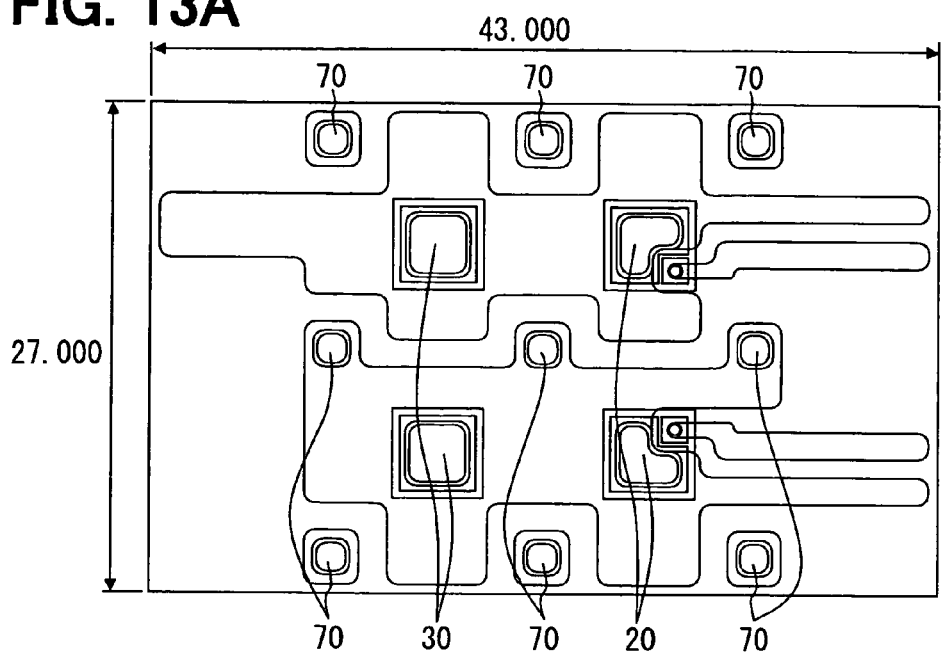
FIGS. 13A to 13D are top plan views showing nine and five post position configurations including the central phase out post.
Figure 13B:
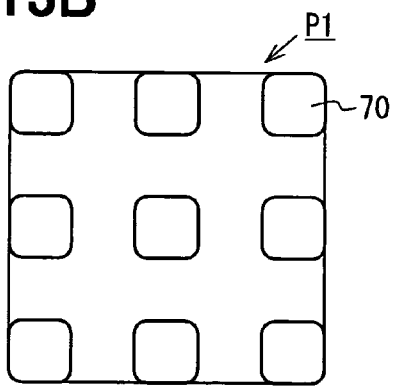
Figure 13C:
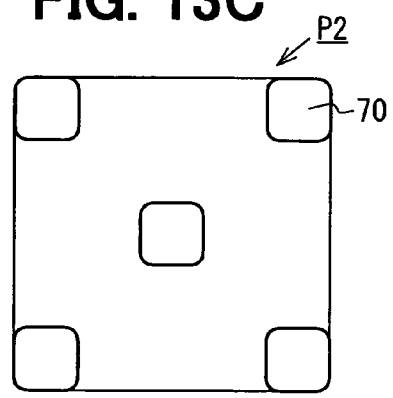
Figure 13D:
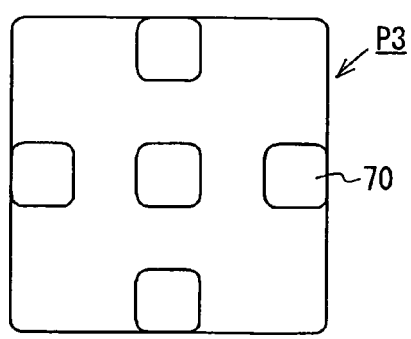
Figure 14A:
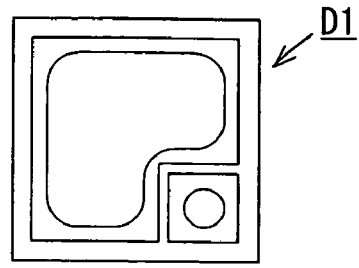
FIG. 14A to 14F are top and bottom plan views showing large and small semiconductor devices on the same chips with a common electrode post layouts.
Figure 14B:
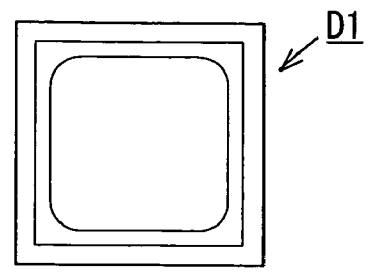
Figure 14C:
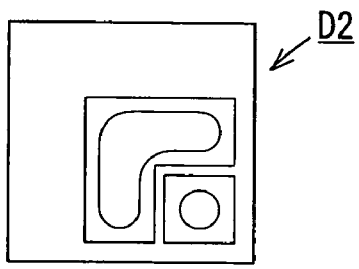
Figure 14D:
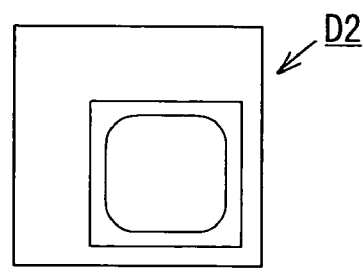
Figure 14E:
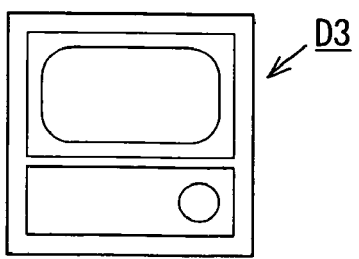
Figure 14F:
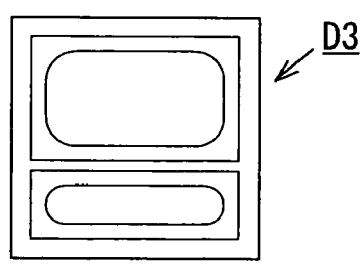

The number of non-electrically active support posts number and the shape is also a parameter as it also plays a role in determining the stress distribution over the whole power electronic package 100. There were three variations of layouts with support posts considered and nine and five support posts configuration were proposed. The central post is connected to the phase out terminal and has the same dimension. In the FIGS. 13B to 13D show possible nine and five posts position configurations including the central phase out post. The upper high thermal conductivity insulating non-planar substrate 1 with nine posts geometry is also shown in the FIG. 13A.

In this embodiment, to cater to both large and small semiconductor devices on the same chips, a common electrode post layouts have been considered as shown in FIGS. 14A to 14D such that they will be aligned to the semiconductor transistor 20 bonding electrode pads of both geometries. Also, in addition to the square control gate configuration, rectangular pads have also been proposed as shown in the FIGS. 14E and 14F. The size of the patterned electrode bonding area is set either substantially slightly smaller than that of the semiconductor transistor 20 bonding electrode pads, and the projecting height of the patterned electrode is set to higher than the external connection buses. The curvature of thin features such as the gate electrodes has been increased to eliminate as many 90-degree corners as possible.

Figure 15A:
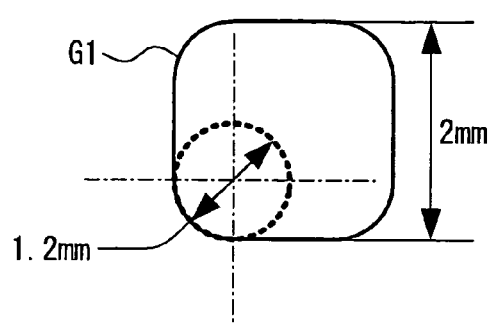
FIGS. 15A and 15B are top plan views showing suggested post curvature.
Figure 15B:
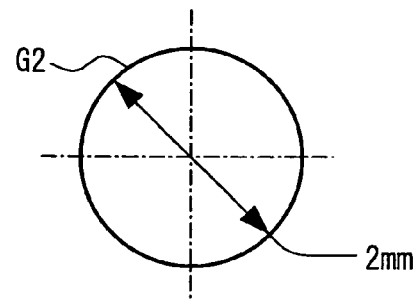
Figure 16:
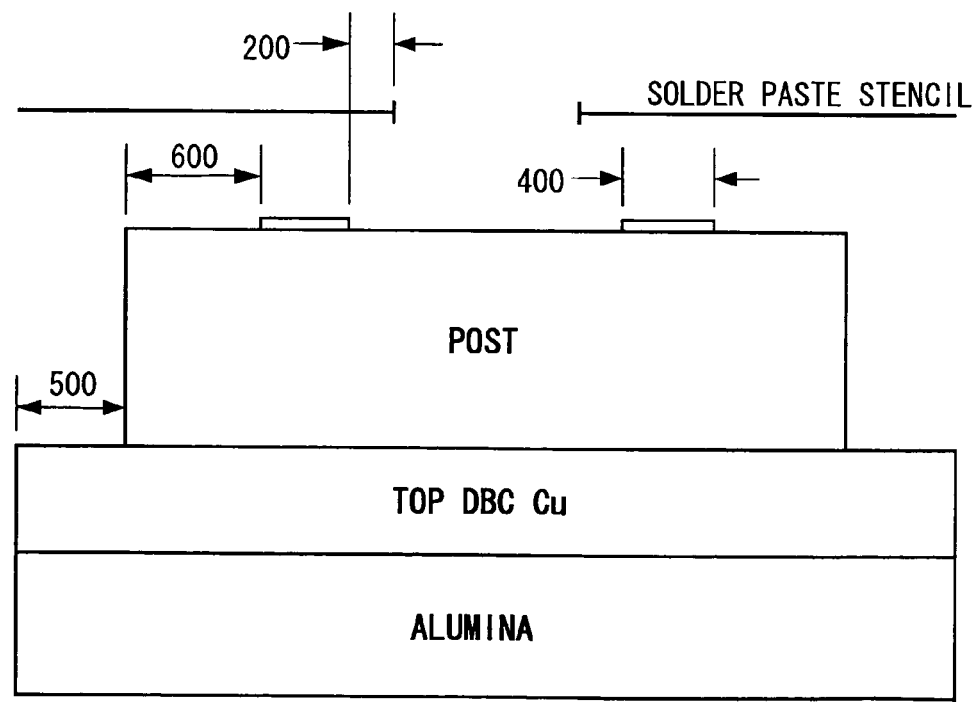
FIG. 16 is a cross sectional view showing suggested layouts guide for the solder resist.
Figure 17A:
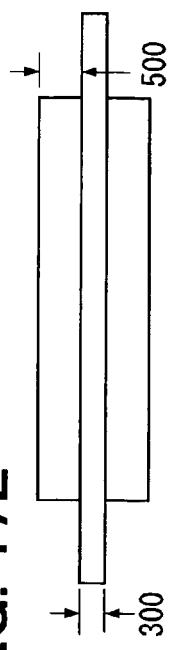
FIGS. 17A to 17D are cross sectional views showing double etching technique with a double bonding process used for the fabrication of non-planar substrates.
Figure 17B:
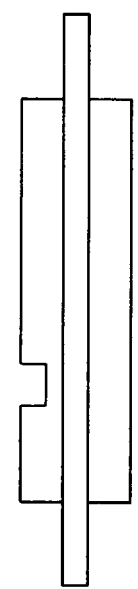
Figure 17C:
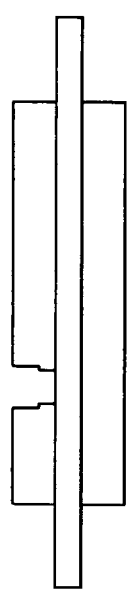
Figure 17D:
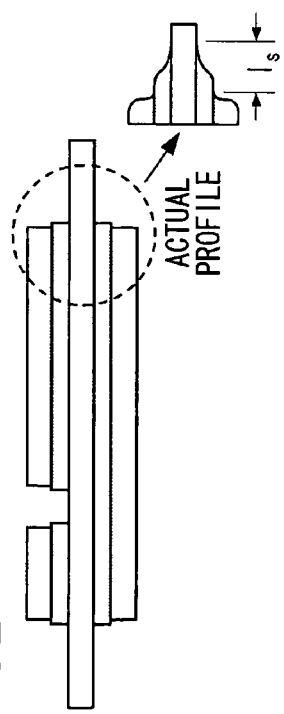
Figure 17E:
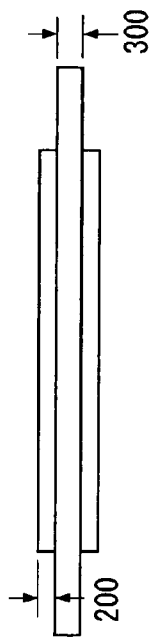
FIGS. 17E to 17G are cross sectional views showing double etching technique with a single bonding process used for the fabrication of non-planar substrates.
Figure 17F:
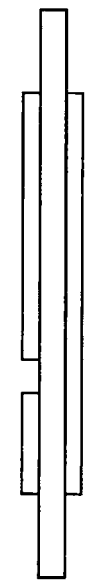
Figure 17G:
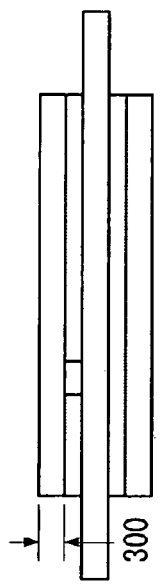
Figure 18A:
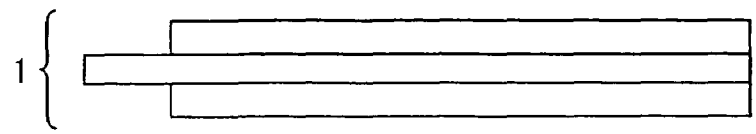
FIGS. 18A to 18C are cross sectional views of the upper high thermal conductivity insulating non-planar substrate showing double etching technique with a single bonding process, FIG. D to 18F are cross sectional views of the lower high thermal conductivity insulating non-planar substrate showing double etching technique with a single bonding process.
Figure 18B:
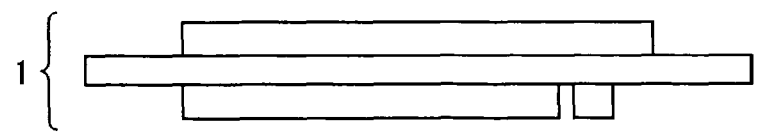
Figure 18C:
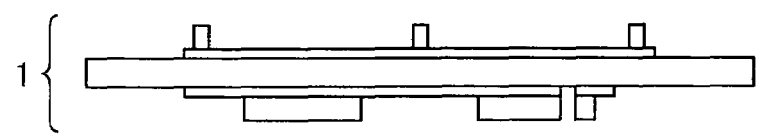
Figure 18D:
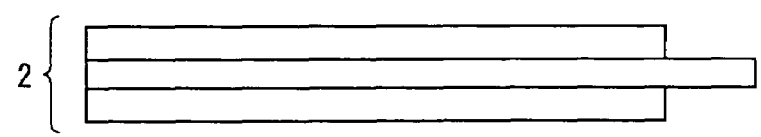
FIGS. 18G to 18I are top and bottom plan views of the upper high thermal conductivity insulating non-planar substrate.
FIGS. 18J to 18L are top and bottom plan views of the lower high thermal conductivity insulating non-planar substrate.
FIG. 18M is a cross sectional view showing an assembly process.
Figure 18E:
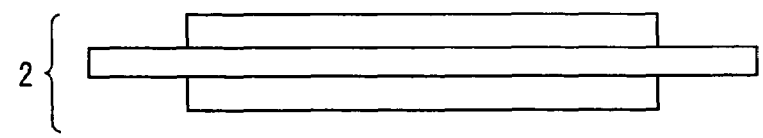
Figure 18F:
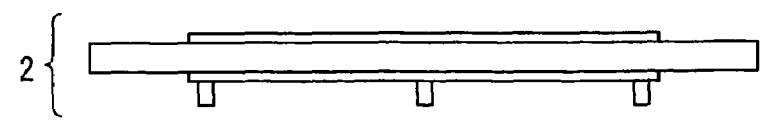
Figure 18G:
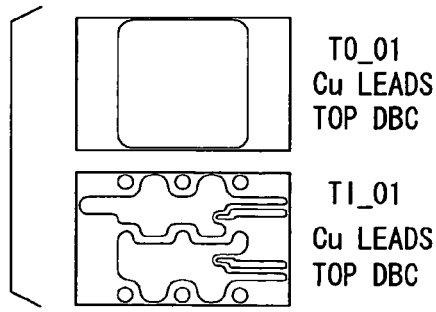
Figure 18J:
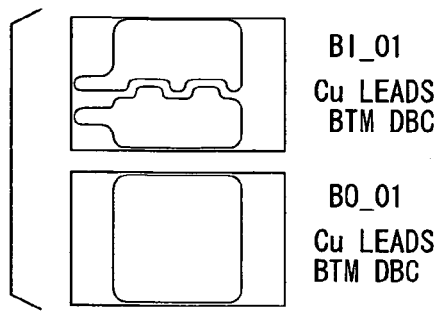
Figure 18H:
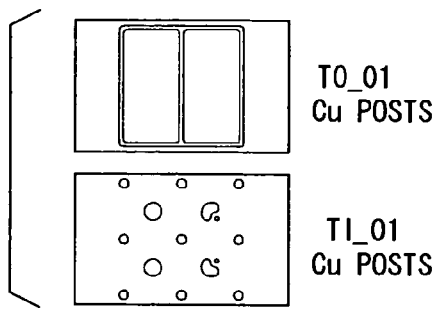
Figure 18K:
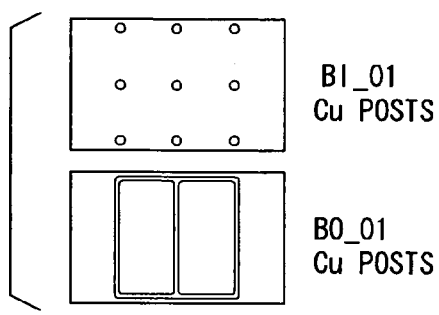
Figure 18I:
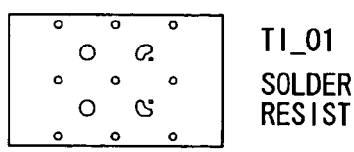
Figure 18L:
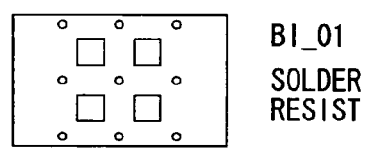
Figure 18M:
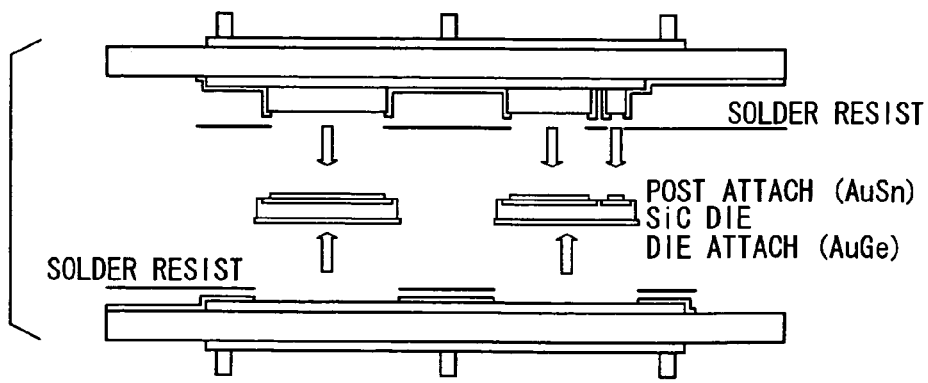
Figure 19:
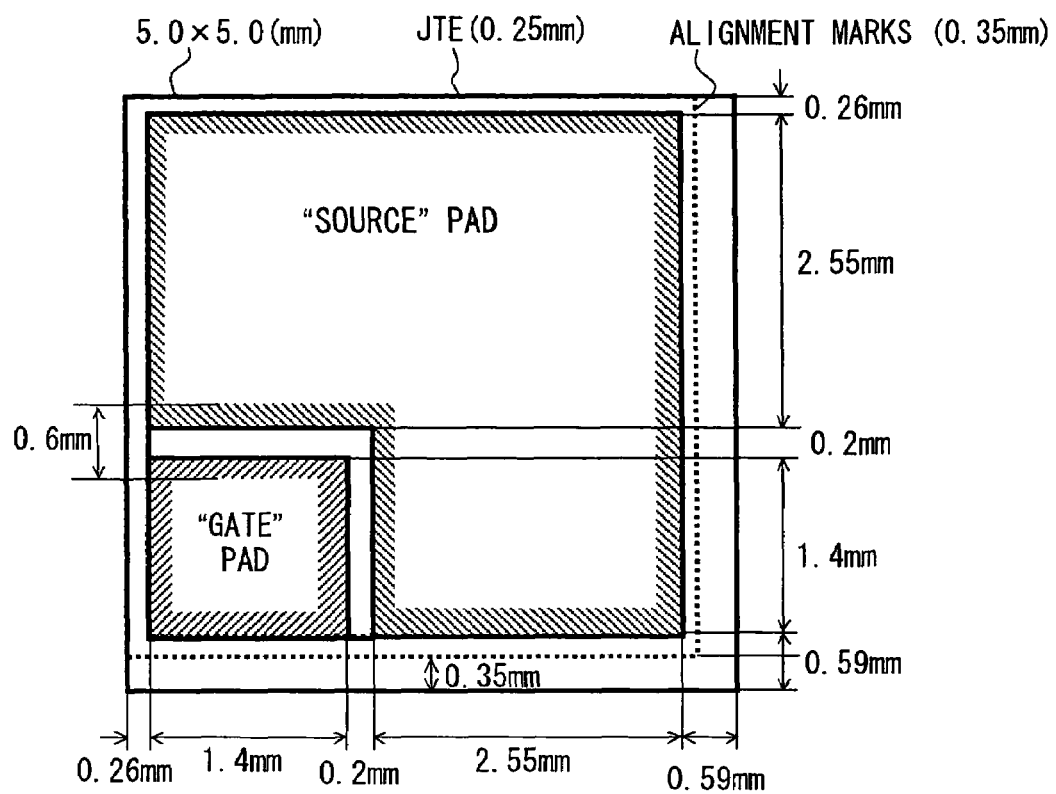
FIG. 19 is a top plan view showing the semiconductor transistor chip single large size bump layout.

The effect of post curvature is considered plays a role in total stress values over the power electronic package 10. A square posts of side for example about 2 mm with edge curvature of for example about 0.6 mm as shown in FIG. 15A. Also, a complete round posts with diameter for example about 2 mm as shown in the FIG. 15B are considered. The stress analysis indicates lower stress values for the G2 curvature compare to the G1. For the bonding of these electric insulating post regions, a solder stopper layer 50 is consider to protect the overflow of the solder 45 which may cause the short circuit after the complete reflow process. Solder resist layers are screen printed onto the posts and have a finite line thickness of for example 400 μm (mean position $Q_s(x,y) \pm 200$ μm). The screen-printing of the solder 45 paste onto the gate pad requires a stencil which has a tolerance of for example 200 μm as shown in FIG. 16. This solder resist can also be applied to the patterned electrodes used electric connection with semiconductor chips. On semiconductor chips, the fabrication process ensures sufficient polyamide coating on the device pads thus making solder stop layers redundant.

The fabrications of these high thermal conductivity insulating non-planar substrates 1, 2 are done by for example etching of the direct bonded copper. The various layers needed for each step is shown alongside the process flow. A double etching technique with either a single or double bonding process is used for the fabrication of non-planar substrates 1, 2 as shown in FIGS. 17A to 17G. In the double bond double etching process, the starting material is for example 300 μm thick ceramic with for example thin copper (200 μm) bonded on either side of it (Step-1 of FIG. 17A). This is then etched as specified by the mask (Step-2 of FIG. 17B) after which 300 μm of thick copper is bonded onto the surface of the etched thin copper (Step-3 of FIG. 17C). Etching of the thick copper then proceeds to give the final patterned direct bonded copper substrate (Step-4 of FIG. 17D). In the single bond technique, 500 μm of thick copper is bonded onto the ceramic to begin with (Step-1 of FIG. 17E), after which two etching processes are carried out to give the etched direct bonded copper substrate as required (Step-2 and 3 of FIGS. 17F and 17G). The double bond double etch process boasts good control over the lateral spread $l_s$ of the etched features (for example within 100 and 250 μm) although the double etching results in an over-etching of the first 200 μm copper layer as shown in the FIG. 18M. The single bond double etch process leaves a much smoother copper surface.

The power electronic package 100 assembly with dies is also shown in FIGS. 18A to 18M. Two high thermal conductive insulating substrates 1, 2 are brought face to face so that the two semiconductor transistor chips 20 and the two diode chips 30 are sandwiched between the two high thermal conductivity insulating substrates 1, 2. As a result of this, the patterned electrode patterns 7a, 7b, 8a, 8b, 9a on the upper high thermal conductivity insulating substrate 1, the control gate electrode 24, drain or collector electrode 25 of the transistor chips 20 and the bottom side cathode electrode 32 of the diode chips 30 on the lower high thermal conductivity insulating substrate 2 side come together with the solder material 45 and/or solder stopper layer 50 there between. Then, the above-mentioned contacting parts being heated with a hot plate or a heating oven or the like carry out reflow soldering. The gap between the high thermal conductivity insulating substrates 1, 2 is controlled uniformly by the electrically inactive bonding posts and is almost double the value of the starting copper metal 7-10 thickness which is for example about 0.3 mm to 5 mm. The gap of the sandwich package also takes in to account the thickness of the solder 45 after reflow process.

In this power electronic package, bonded regions control the mechanical separation of the non-planar substrates 1, 2, therefore, there is no need to insert spacers between the two high thermal conductivity insulating non-planar substrates 1, 2. The number, placement, geometry, composition of the bonded regions to produce a net axially-directed compressive force in the components after assembly. This will reduce the stress on the semiconductor chips. In brazing the semiconductor chips to the electrode patterns of the high thermal conductivity insulating substrates 1, 2, the brazing materials are screen printed attached on the bonding parts of the electrode patterns, or alternatively a foil of a brazing material may be sandwiched between the electrodes of the semiconductor chips and the bonding parts of the electrode patterns.

Figure 20:
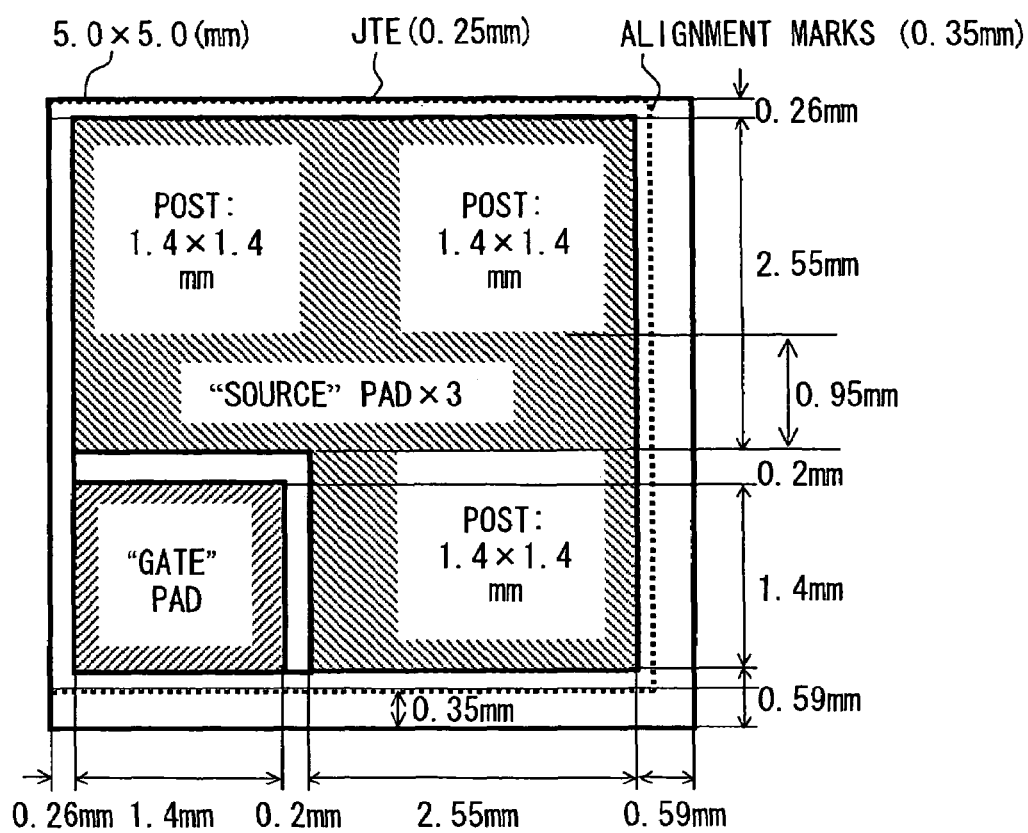
FIG. 20 is a top plan view showing the semiconductor transistor chip multiple large size bump layout.
Figure 21:
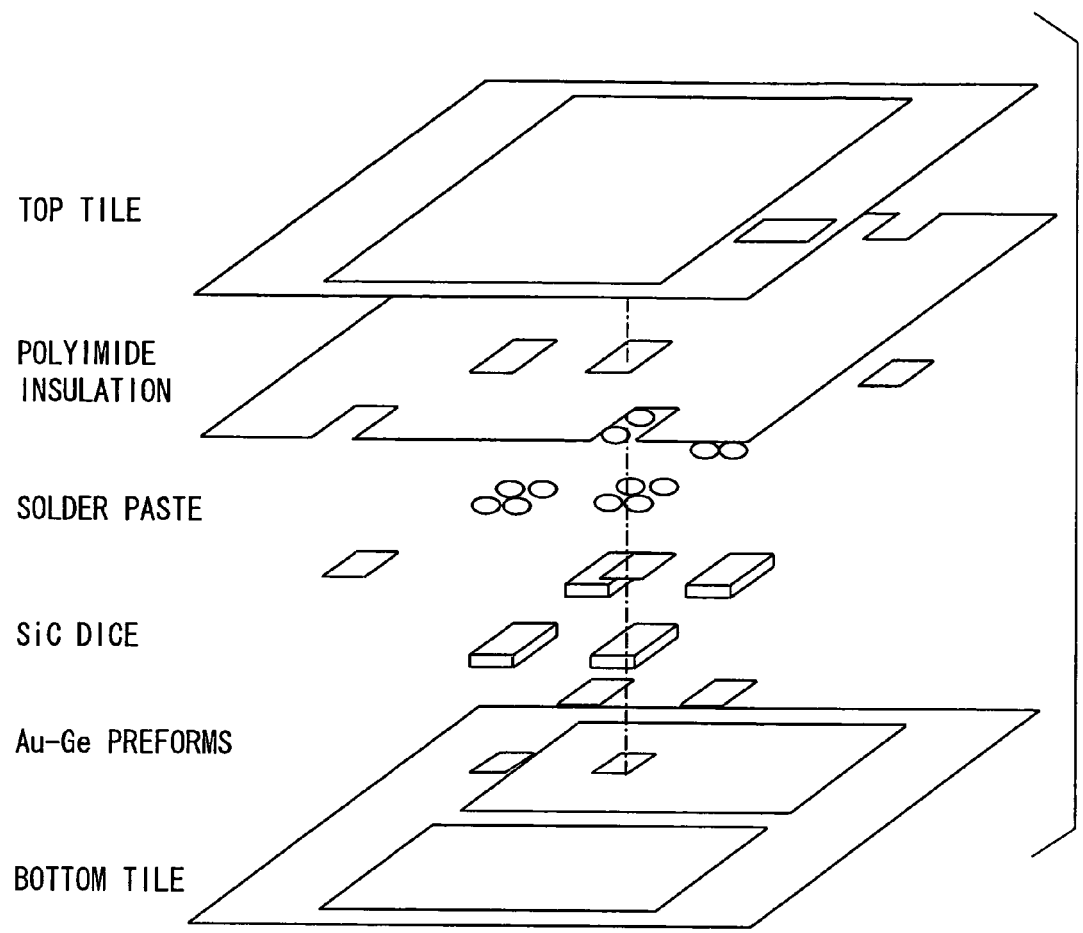
FIG. 21 is an exploded view showing the power electronic package assembly process using the alternative polymide insulation sheet.

In this embodiment all semiconductor chips are soldered to the lower high thermal conductivity insulating substrate 2 in the first soldering operation (higher melting point solder 45 for example AuGe) and then the upper high thermal conductivity insulating substrate 1 is brought together and second soldering operation is carried out (lower melting point solder 45 for example AuSn). Alternatively, this assemble process can be carried out in a single soldering operation with the semiconductor chips sandwiched between the high thermal conductivity insulating substrates 1, 2, using the same melting point solder 45 for example AgSn, transient liquid phase process. In the second soldering operation, solder 45 large size bumps can be used as it can provide a control over the amount of solder 45 used in the soldering operation as shown in the FIG. 19. Here, in FIG. 19, the "Source" pad has a post of 3.75×3.75 mm², and an opening for the source (i.e., 4.15× 4.15 mm2 gate). The "Gate" pad has a post of 1.0×1.0 mm², and an opening for the gate (i.e., 1.4×1.4 mm² gate). For main electrode pads, several large size solder bumps can be formed on the semiconductor chips instead of one single bump as shown in FIG. 20. Here, in FIG. 20, the "Source" pad has a post of 3.75×3.75 mm², and an opening for the source (i.e., 4.15×4.15 mm2 gate). The "Gate" pad has a post of 1.0×1.0 mm², and an opening for the gate (i.e., 1.4×1.4 mm² gate). As the material of these bumps, gold based solder 45 is preferable for example AuGe and AuSn. To control the solder 45 thickness on the patterned electrodes on the high thermal conductive insulating non-planar substrates 1, 2, a solder stopper resist 50 can also be used to control the solder 45 amount after the reflow process. After the above-mentioned bonding is carried out, an insulating resin for example silicone resign is filled between the two high thermal conductivity insulating substrates 1, 2 and hardened by backing at a specific temperature. An encapsulant filling in the gap results in the elimination of air pockets in the structure, which consequently leading to air breakdown when high electric fields are involved. Alternatively a polymide insulation sheet can be inserted between the two highly conductive insulating non-planar substrate in the assembly process as shown in the FIG. 21.

According to this embodiment, semiconductor chips are sandwiched by two high thermal conductivity insulating substrates 1, 2 and the electrodes of the semiconductor transistor 20 and diode chips 30 and electrode patterns of the high thermal conductivity insulating substrates 1, 2 are bonded by brazing (for example AuSn and AuGe soldering) to make a power electronic package. The heat produced by the semiconductor chips are transmitted smoothly from the upper surfaces and the lower surface of the semiconductor chips to the high thermal conductivity insulating substrates 1, 2 and is thereby radiated swiftly.

Figure 22:
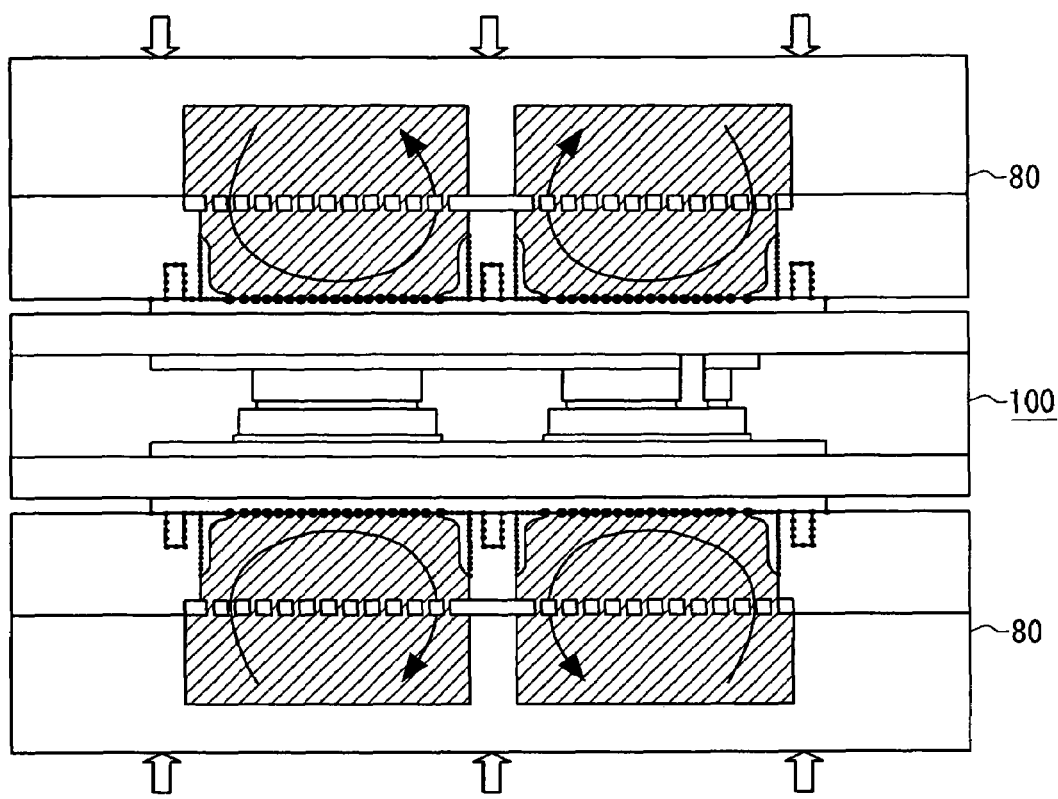
FIG. 22 is a cross-sectional view showing a power electronic package with integrated sealed heat exchanger unit.
Figure 23:
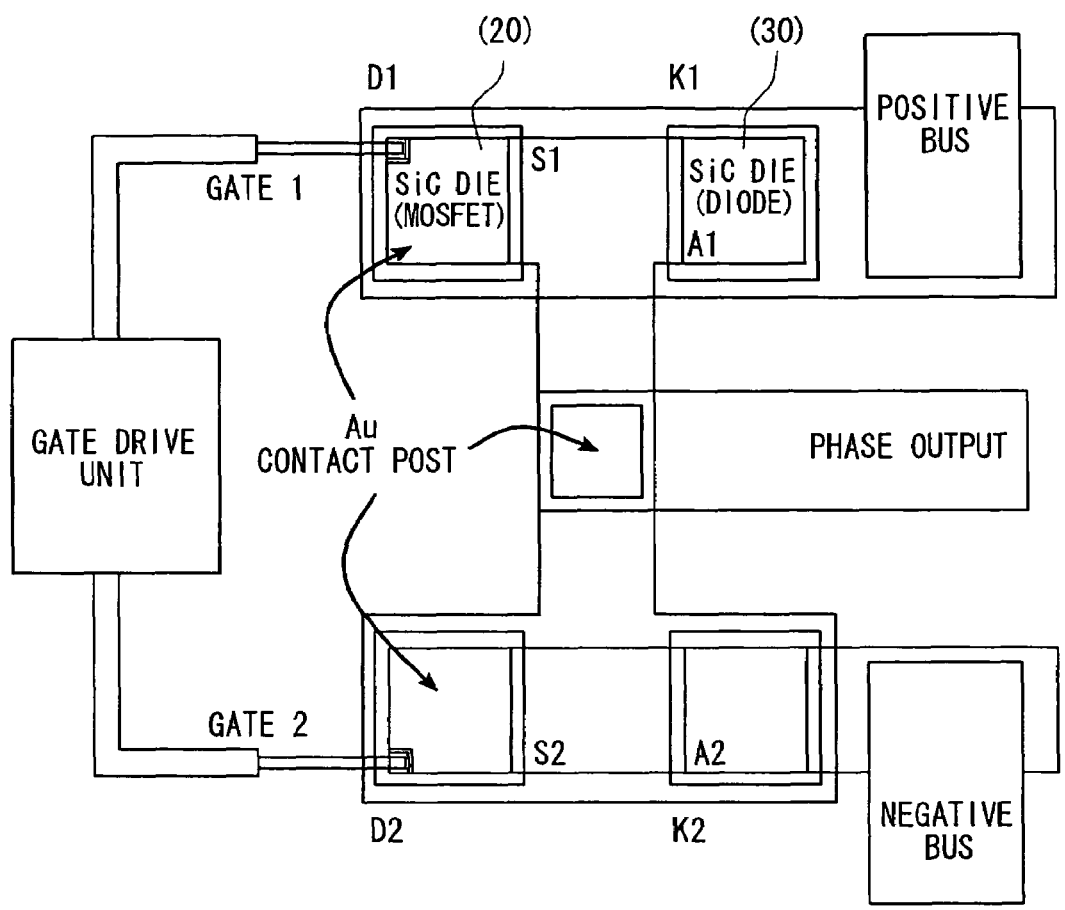
FIG. 23 is a top plan view showing an electrical circuit diagram of the power electronic package.

The outer surface of the two high thermal conductive insulating non-planar substrates 1, 2 has been step etched to form ridges i.e., the metal 43, so as to improve integration with the heat exchanger 80. The heat exchanger 80 has got milled groves on its bottom surface, as shown in FIG. 22. Etching a raised periphery (ridge structure) around the outer edge of the exposed copper would enable the heat exchanger 80 body to sit firmly in place. A heat exchanger 80 unit is sealed using the same insulating resin or using the low temperature solder as shown in the FIG. 22

A power electronic package 10 described in this embodiment houses a half-bridge power stage. It consists of two semiconductor transistors 20 connected in series, each with its own recovery diode 30 also of the same rating. An electrical circuit diagram of the power electronic package 10 manufactured in the way described above is shown in FIG. 23. The layout of the semiconductor chips in the power electronic package 10 is shown in figure. As shown, the drain or collector electrode of a transistors 20 are connected to a positive DC bus terminal, the source or emitter of the transistors 20 are connected to a negative DC bus terminal and the gate of the transistors 20 are connected to a gate drive unit terminals. Similarly, the terminals of diodes 30 are connected to the drain or collector and the source or emitter of the transistors 20 with respective polarity. The drain or collector of a second transistor 20 is connected to the source or emitter of the first transistor 20, and the gate of the second transistor 20 is also connected to a gate drive unit terminal. The central bonding area connects the upper and lower DC buses terminals to give the phase out signal. The terminals of a second diode 30 are connected with the polarity to the drain or collector and the source or emitter of the second transistor 20. Such a construction can be extended from explained half-bridge circuit to a full three-phase inverter circuit by bonding the multiple semiconductor chips.

Figure 24A:
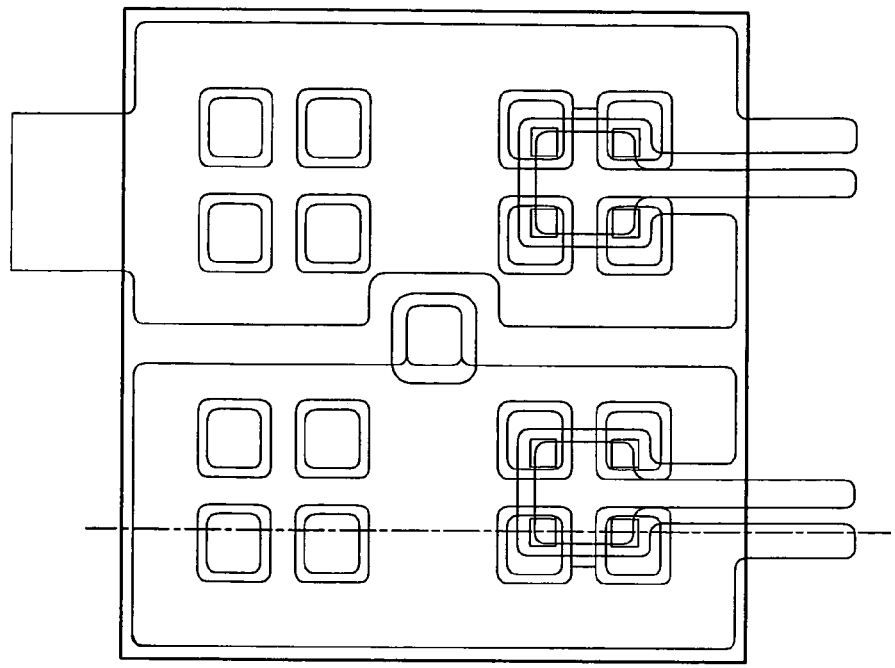
FIGS. 24A and 24B are top plan and cross-sectional views showing multiple chip power electronic package.
Figure 24B:
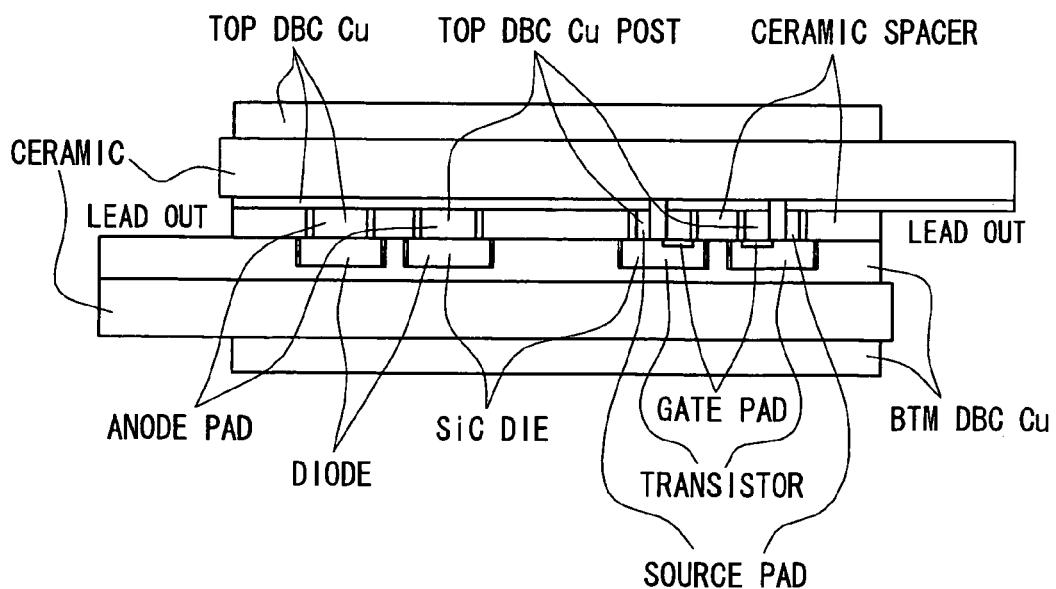

A power electronic package 100 described in this embodiment, two different semiconductor chip configurations were proposed for the half bridge power electronic package 100, whereas the first one uses the single semiconductor chip is used to meet the power module current specifications, while the second one uses multiple chips to meet the same module current specifications. The multiple-chip configuration uses the smaller size of the semiconductor chips. For example, main layouts that were chosen to be fabricated the said geometries where single 5 mm square chips and four 3 mm square chips (in parallel) were used respectively. Details of all the configurations of the semiconductor chips designed for the sandwich power electronic package 100 are shown in FIGS. 24A and 24B. In these figures, although four semiconductor transistor 20 and diode chips 30 were described here, however, this is not because of any limitation, and alternatively multiple semiconductor chips may be used in the power electronic package 100. For higher power requirements, package layouts with one, to six or more semiconductor chips (connected in parallel again) may be used in the power electronic package 100. Thus the number of semiconductor chips connected in parallel in each group can be appropriately determined to suit the current capacity specification of the power electronic package 100.

The external bus connection terminals are provided in the electrode patterns of the high thermal conductivity insulating substrates 1, 2. A laser ceramic ablation, ceramic cut, or pealing of the external connection buses copper can expose the electrical connection buses after the full assembly. Therefore, it is possible to eliminate the work of providing separate terminals for connections to external lines and connecting these terminals to the electrode patterns. In particular, in this embodiment, among the external line connection terminals, the main DC buses terminals are provided extending in the same direction, and the control electrode terminals for the gate driver unit are provided extending in the opposite direction to the main electrode terminals. With this construction, because it becomes easy for control lines and power lines to be kept apart, the construction is resistant to electro-magnetic interference noise. In addition, such electrode layouts design effective in reducing the stray inductance of the power electronic package 100.

In a second example embodiment, the power electronic package will be described with reference to FIG. 25 through FIG. 31. The differences between this embodiment and the first embodiment will be described.

Figure 25:
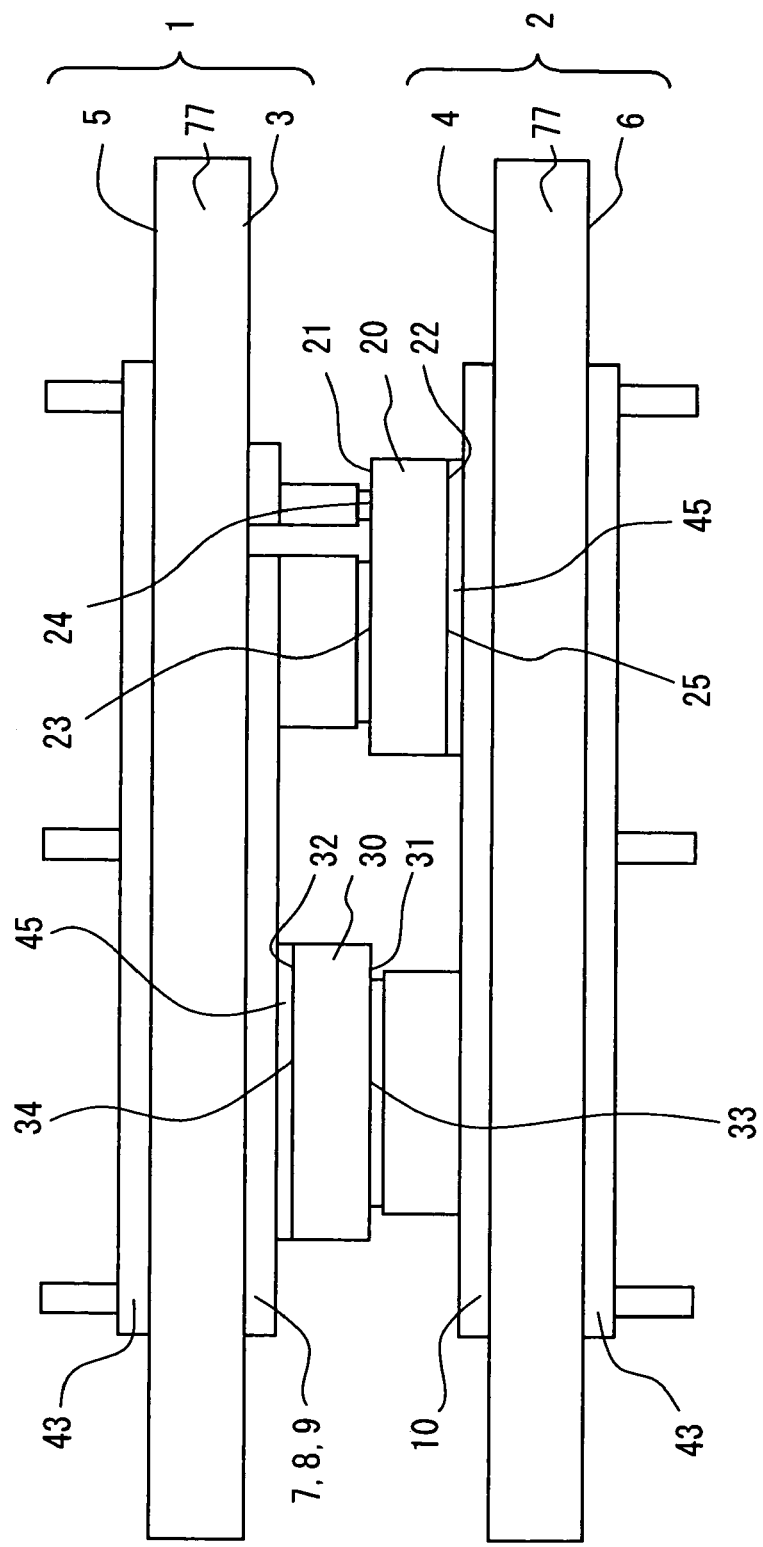
FIG. 25 is a cross-sectional view showing another power electronic package.
Figure 26A:
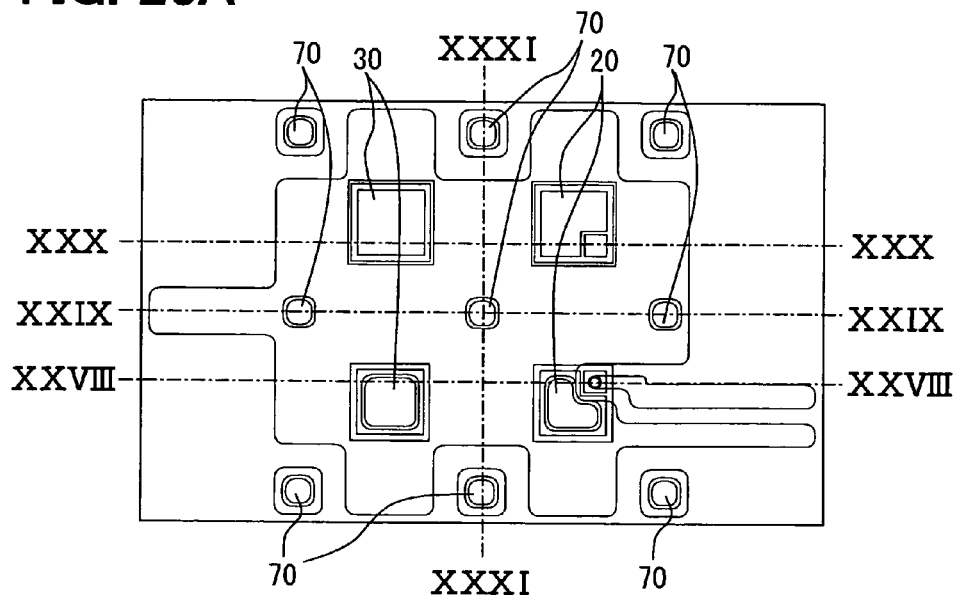
FIGS. 26A and 26B are top and bottom plan views with cut line marks of a upper high thermal conductivity insulating substrate.
Figure 26B:
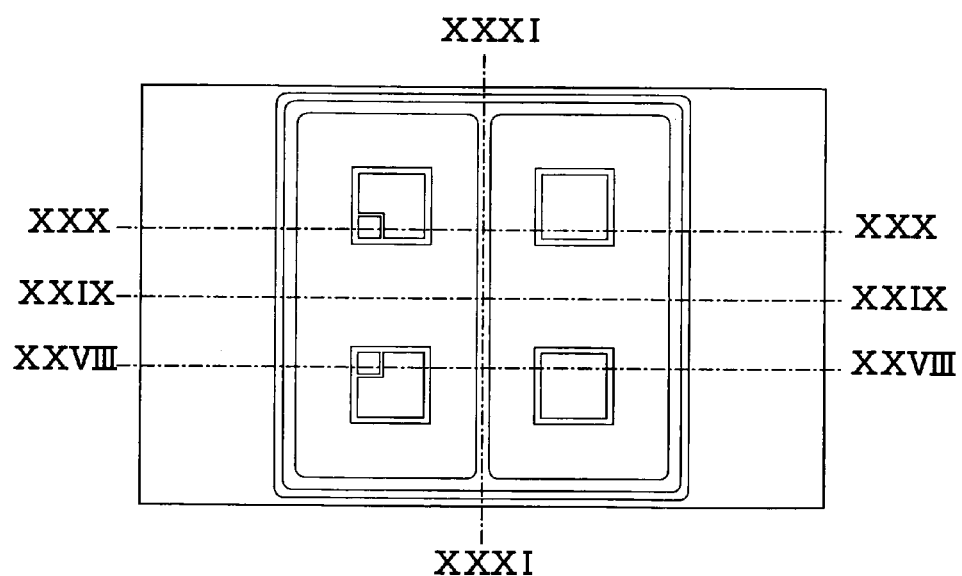
Figure 27A:
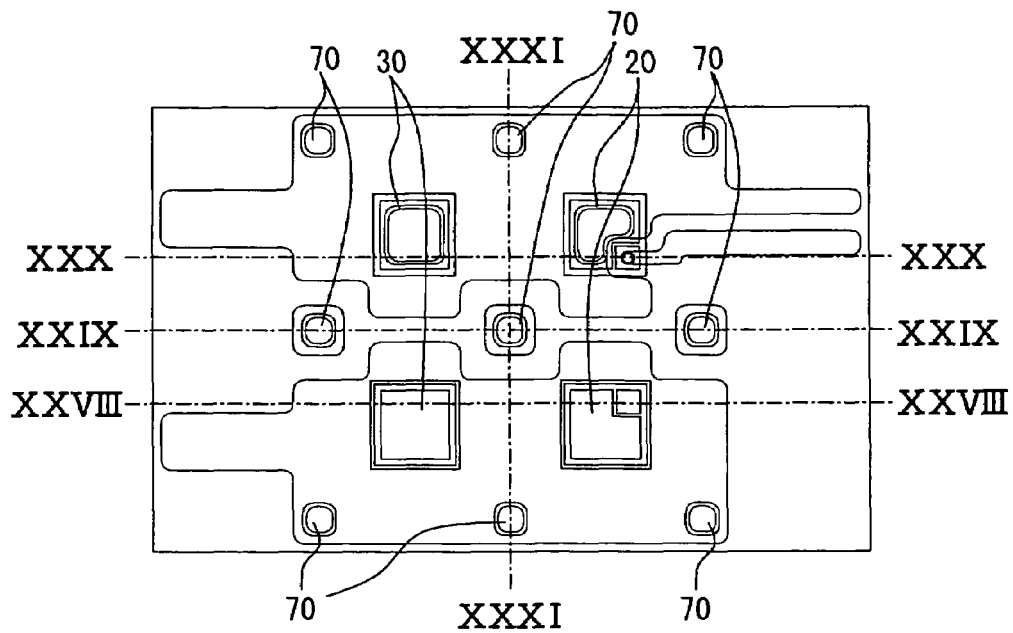
FIGS. 27A and 27B are top and bottom plan views with cut line marks of a lower high thermal conductivity insulating substrate.
Figure 27B:
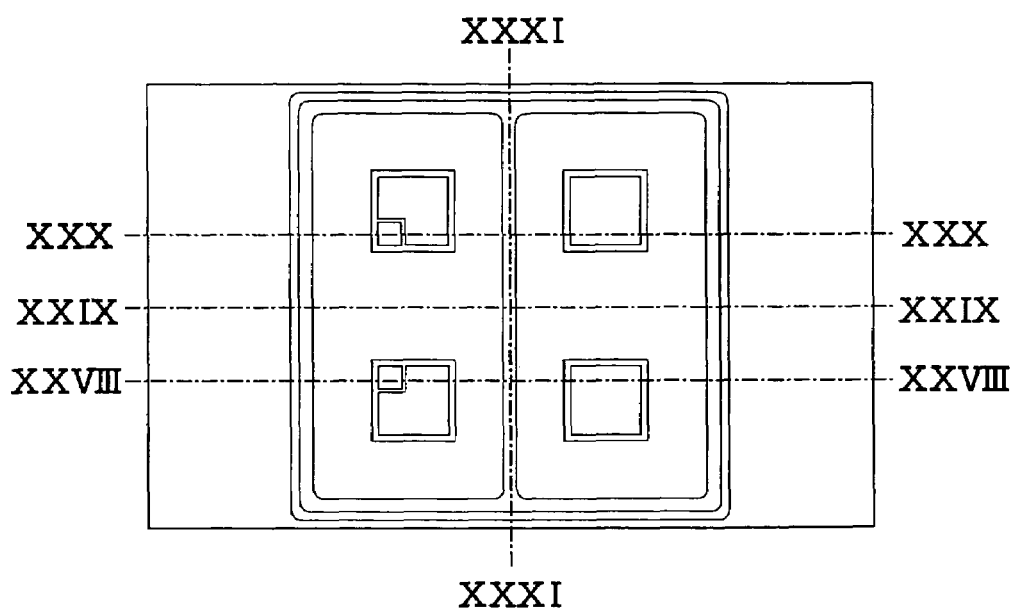
Figure 28:
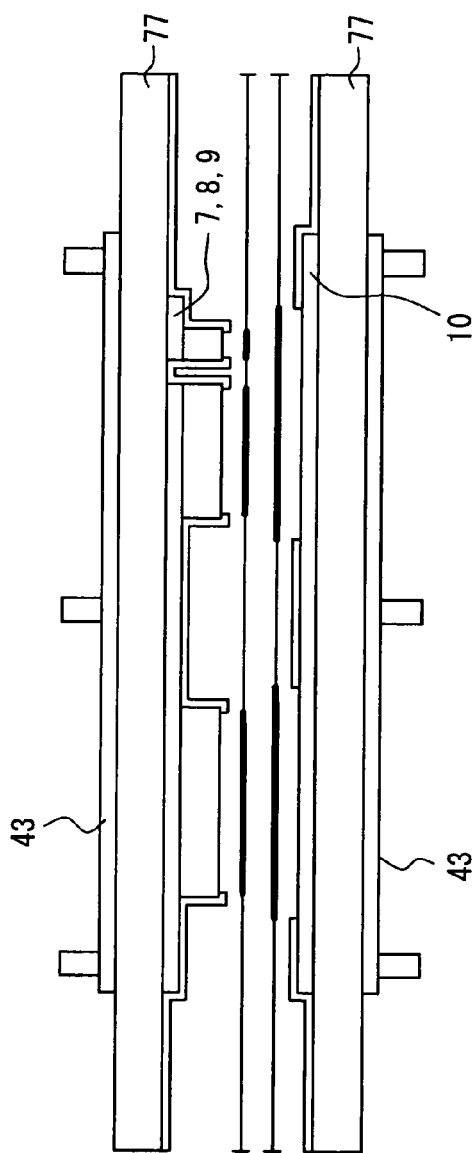
FIG. 28 is a cross-sectional view of the power electronic package taken along line XXVIII-XXVIII in FIGS. 26A to 27B.
Figure 29:
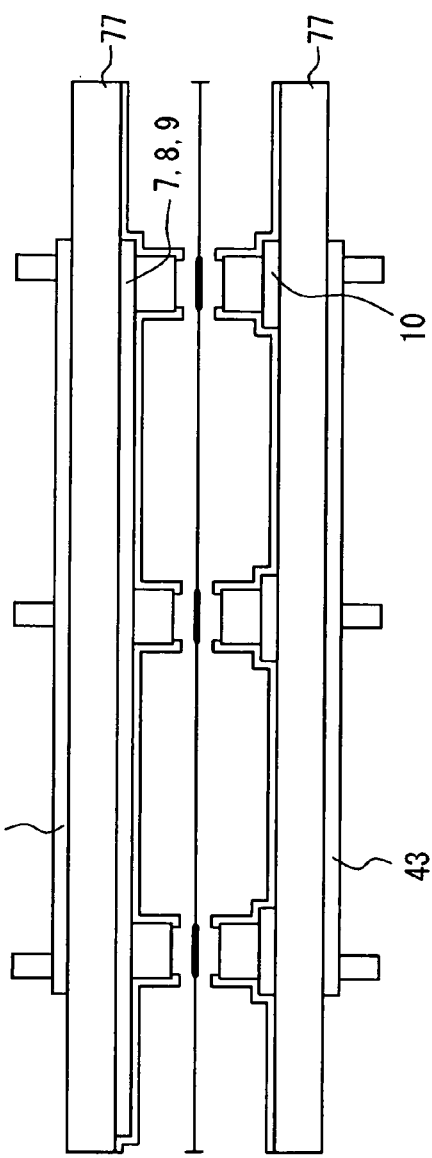
FIG. 29 is a cross-sectional view of the power electronic package taken along line XXIX-XXIX in FIGS. 26A to 27B.
Figure 30:
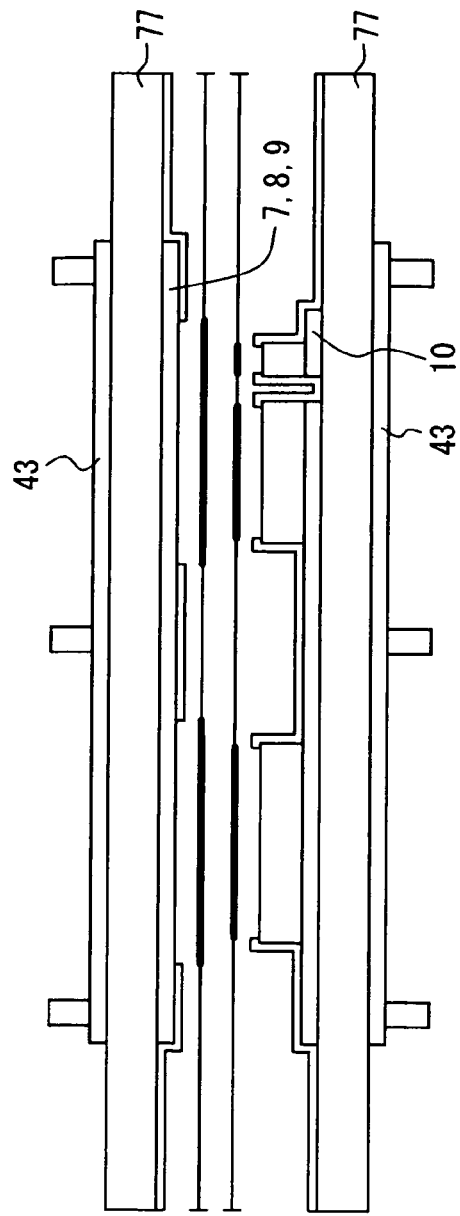
FIG. 30 is a cross-sectional view of the power electronic package taken along line XXX-XXX in FIGS. 26A to 27B.
Figure 31:
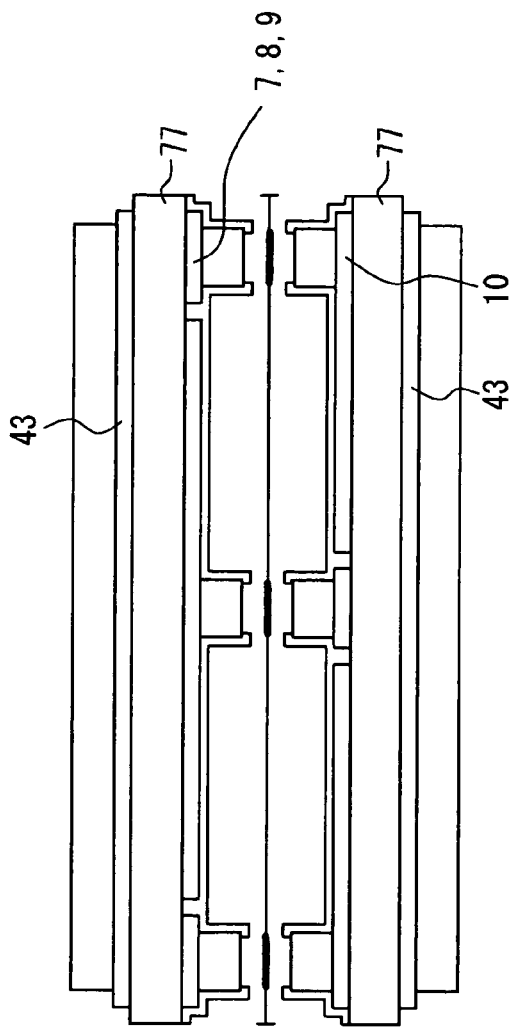
FIG. 31 is a cross-sectional view of the power electronic package taken along line XXXI-XXXI in FIGS. 26A to 27B.

In this embodiment as shown in FIG. 25, the semiconductor chips are mounted on both upper and lower high thermally conductive insulating non-planar substrates 1, 2 in a symmetrical manner. The semiconductor transistor 20 and diode chips 30 having their two principal surfaces front-rear reversed with respect to each other are sandwiched between the two high thermal conductivity insulating substrates 1, 2. Specifically, first transistor 20 and first diode chips 30 are soldered to the upper high thermal conductivity insulating substrate 1 and second transistor 20 and diode chips 30 are soldered to the lower high thermal conductivity insulating substrate 2, which are in a front-rear reversed relationship to each other. The rest of the construction of the second embodiment is the same as that of the first embodiment. With this kind of construction also it is possible to improve the thermal heat generation and shear stress distribution within the power electronic package 100.

FIGS. 26A to 27B show the cut line marks on the top plan view of an upper and lower high thermal conductivity insulating substrate according to the second embodiment. The cross-sectional views along the lines XXVIII-XXVIII, XXIX-XXIX, XXX-XXX and XXXI-XXXI are shown in the FIGS. 28, 29, 30 and 31, respectively. As shown in these figures, the upper and lower high thermal conductivity insulating non-planar substrates 1, 2 is made up of a substantially rectangular shape, which also includes the external connection buses. First semiconductor transistor 20 and first diode 30 and second semiconductor transistor 20 and second diode chips 30 are soldered on the upper and lower high thermal conductivity insulating non-planar substrate 1, 2, respectively.

In a third example embodiment, the power electronic package will be described with reference to FIG. 32 through FIG. 37. The differences between this embodiment and the first embodiment will be described.

Figure 32:
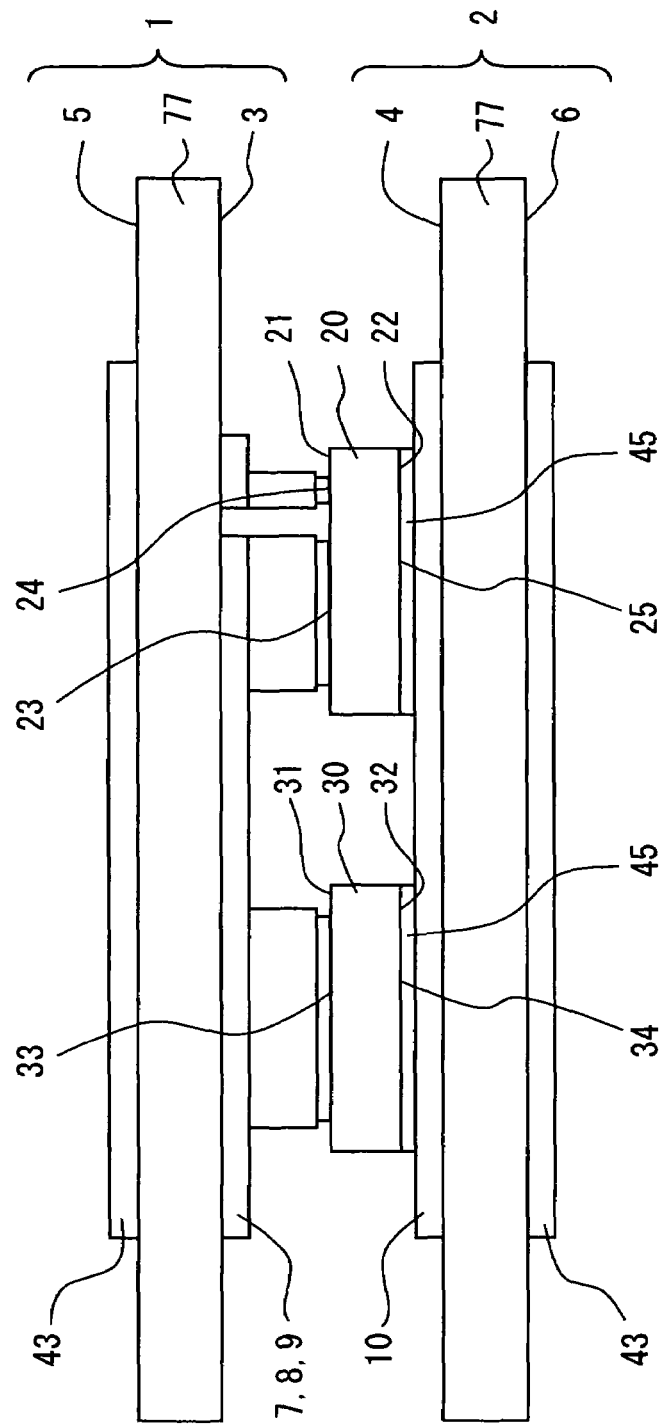
FIG. 32 is a cross-sectional view showing further another power electronic package.
Figure 33A:
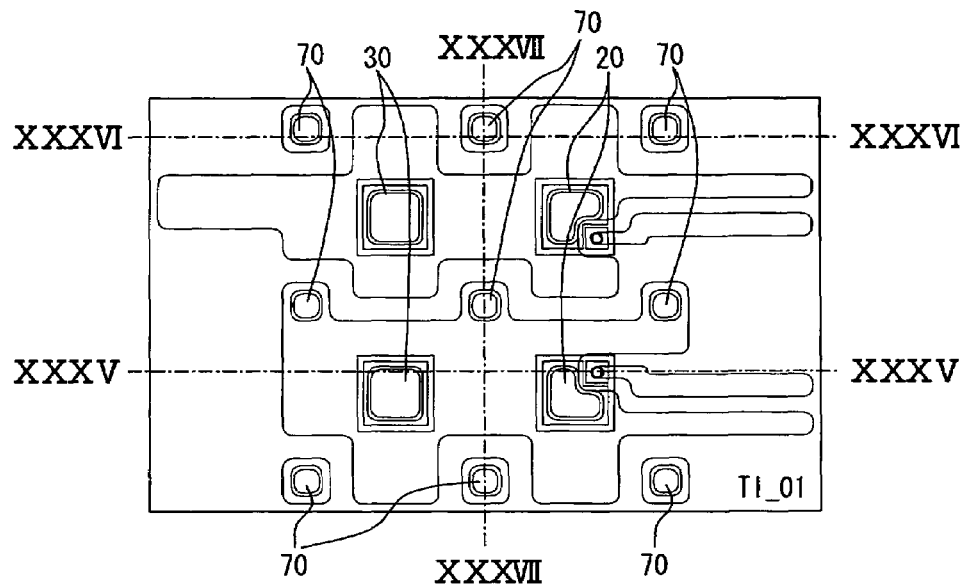
FIGS. 33A and 33B are top and bottom plan views with cut line marks of an upper high thermal conductivity insulating substrate.
Figure 33B:
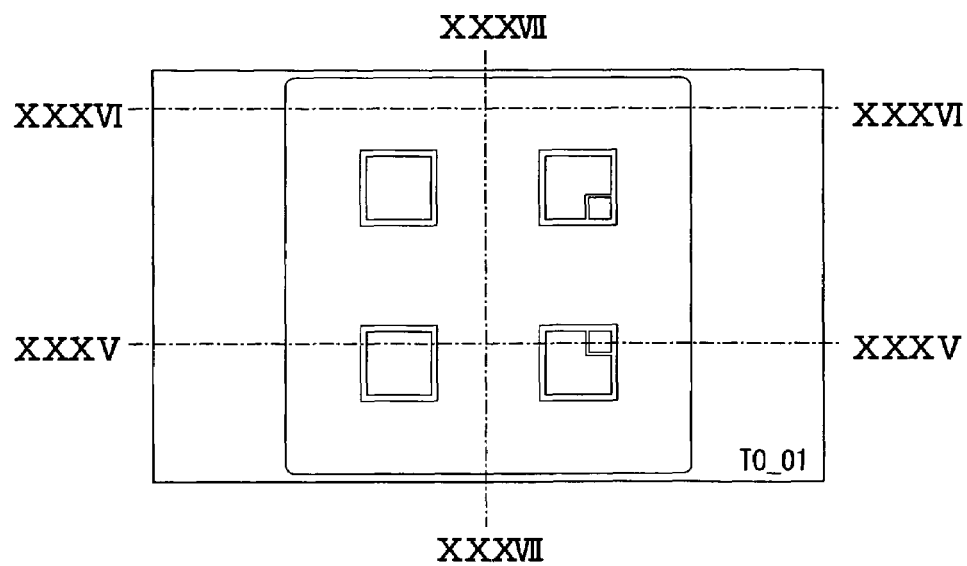
Figure 34A:
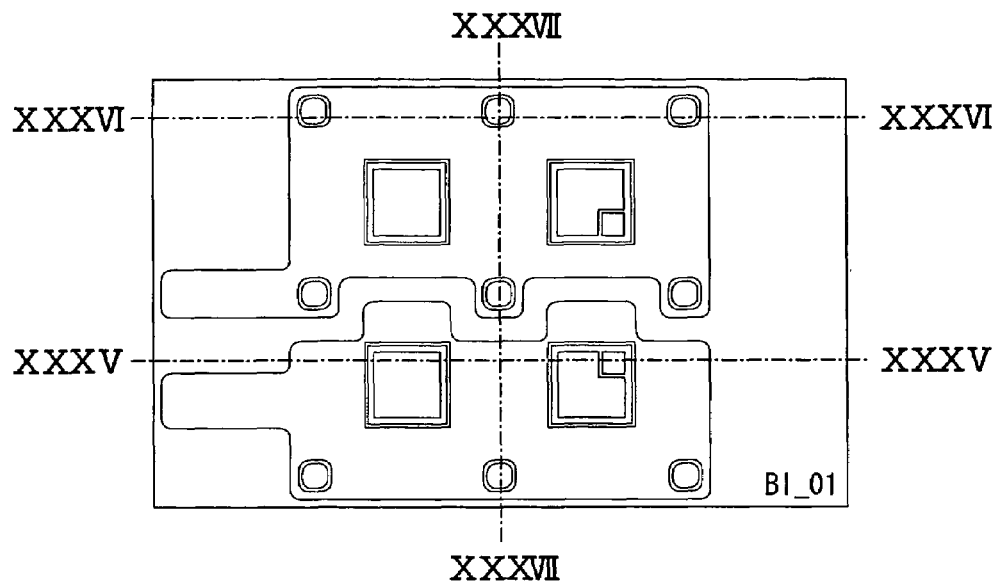
FIGS. 34A and 34B are top and bottom plan views with cut line marks of a lower high thermal conductivity insulating substrate.
Figure 34B:
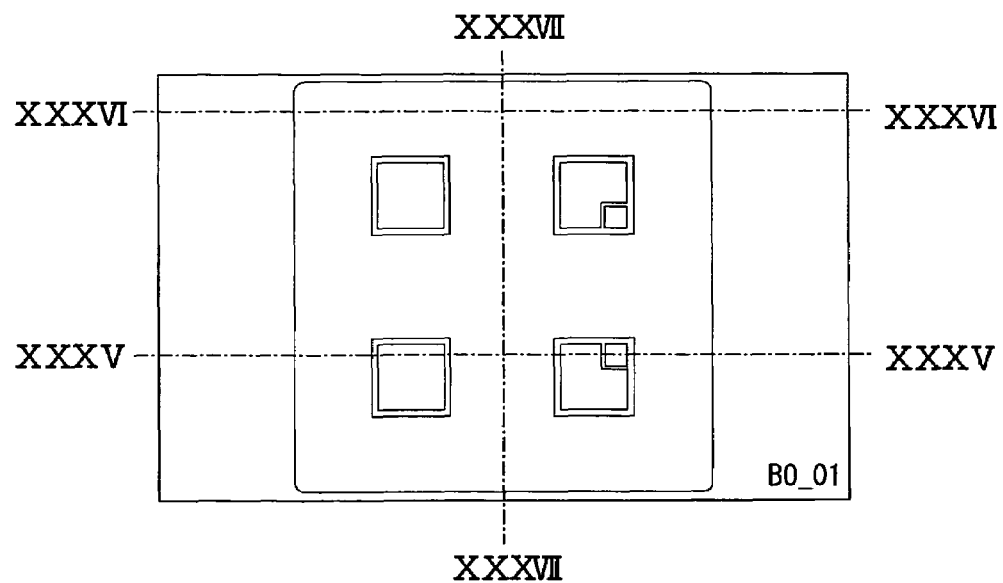
Figure 35:
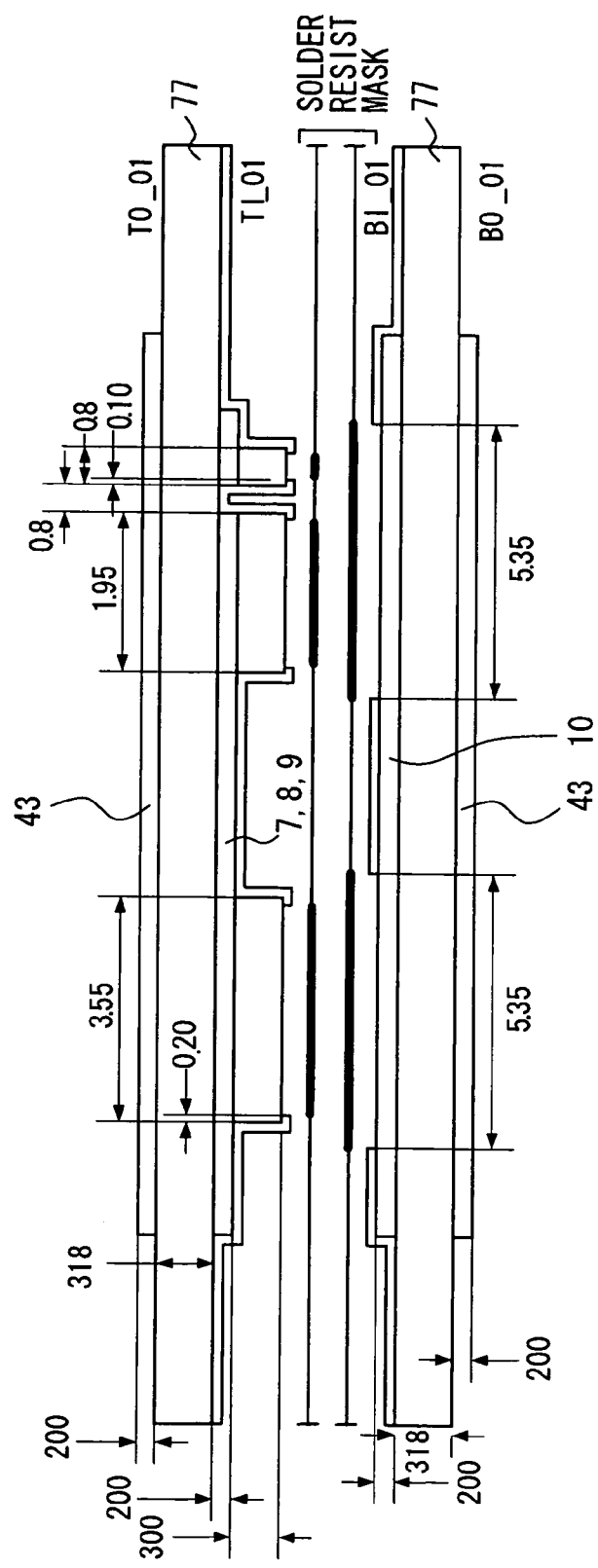
FIG. 35 is a cross-sectional view of the power electronic package taken along line XXXV-XXXV in FIGS. 33A to 34B.
Figure 36:
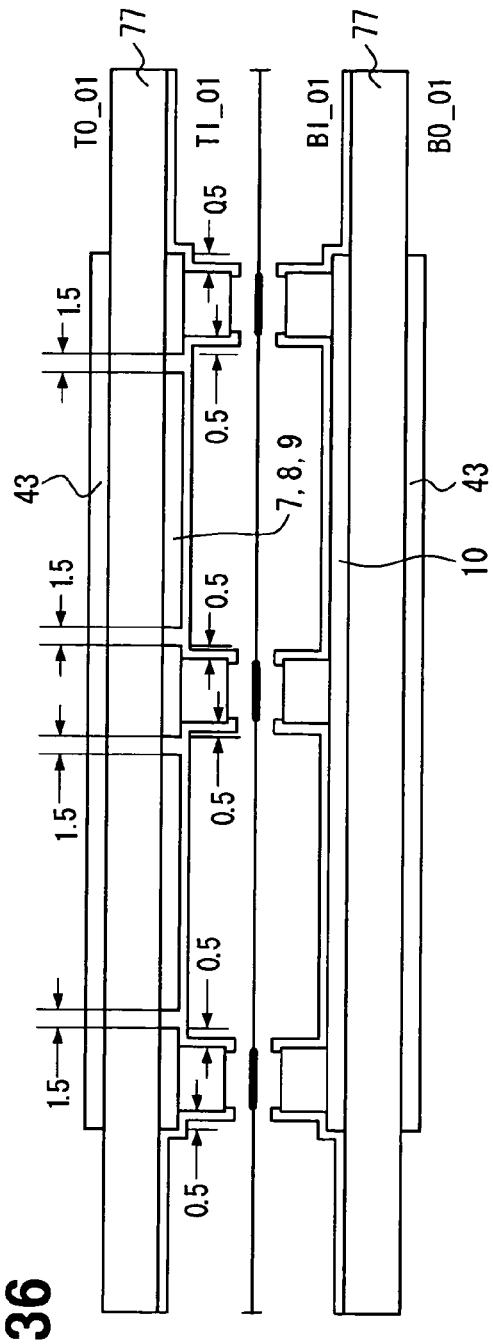
FIG. 36 is a cross-sectional view of the power electronic package taken along line XXXVI-XXXVI in FIGS. 33A to 34B.
Figure 37:
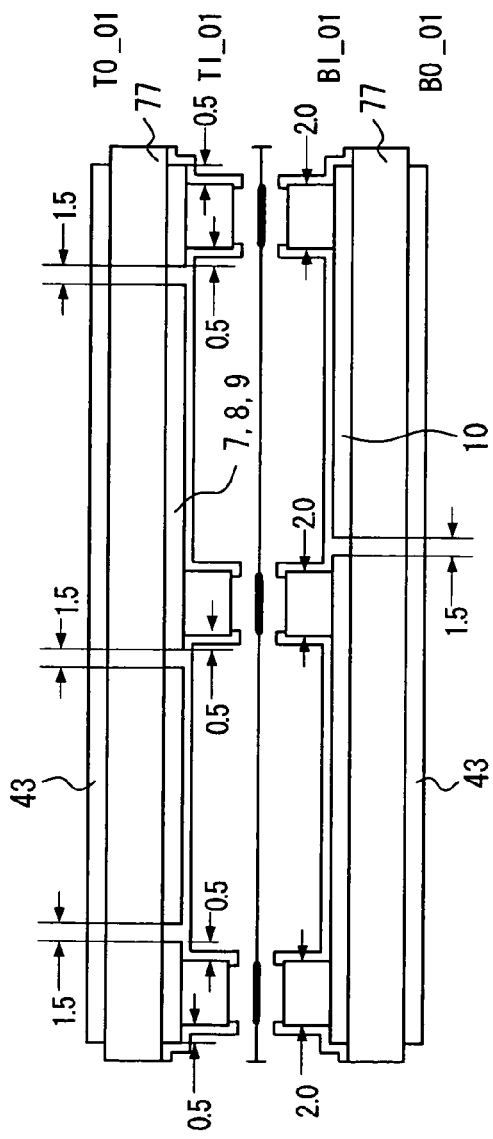
FIG. 37 is a cross-sectional view of the power electronic package taken along line XXXVII-XXXVII in FIGS. 33A to 34B.

In this embodiment, as shown in FIG. 32, the outer surface of the two high thermal conductive insulating non-planar substrates 1, 2 has not been etched for the improved integration with the heat exchanger 80. This embodiment provide a freedom to use a integrated as well as a non integrated heat exchanger 80 for cooling the both side of the sandwich structure. The flat outer surface of the two high thermal conductive insulating non-planar substrates 1, 2 is suitable for using closed type micro-channel heat exchanger 80 unit using a thermal component in between to improve the heat radiation performance. However, this leads to a larger thermal resistance of the power electronic package 100, however, this configuration relax the total stress on the sandwich structure due to lack of direct bonding of the heat exchanger 80 unit. This structure can also be mounted on the air-cooled heat exchanger 80 units. The rest of the construction of the second embodiment is the same as that of the first embodiment.

FIGS. 33A to 34B show the cut line marks on the top plan view of an upper and lower high thermal conductivity insulating substrates. The cross-sectional views along the lines XXXV-XXXV, XXXVI-XXXVI and XXXVII-XXXVII are shown in the FIGS. 35, 36, and 37, respectively. As shown in these figures, the upper and lower high thermal conductivity insulating non-planar substrates 1, 2 are made up of a substantially rectangular shape, which also includes the external connection buses. Two semiconductor transistor 20 and two semiconductor diode chips 30 are soldered on the lower high thermal conductivity insulating non-planar substrate 2.

In a fourth example embodiment, the power electronic package will be described with reference to FIG. 38 through FIG. 44. The differences between this embodiment and the first embodiment will be described.

Figure 6:
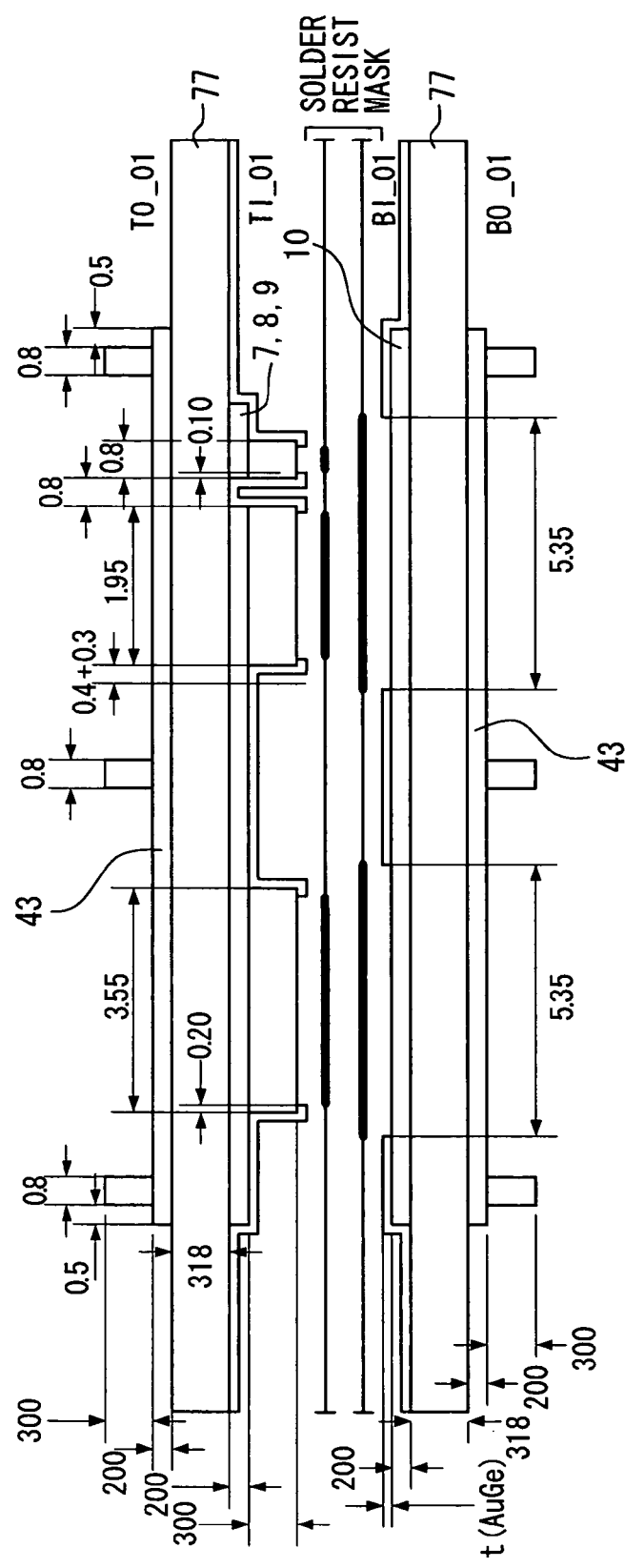
FIG. 6 is a cross-sectional view of the power electronic package taken along line VI-VI in FIGS. 5A to 5D.
Figure 7:
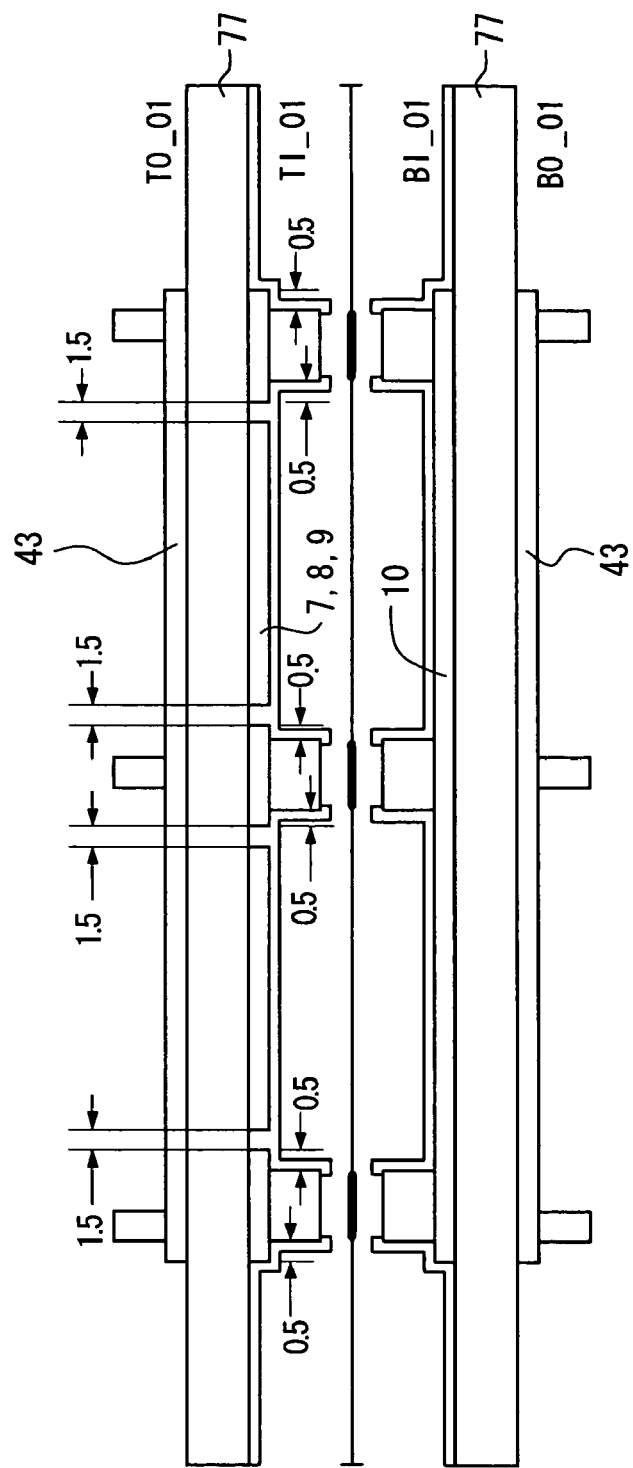
FIG. 7 is a cross-sectional view of the power electronic package taken along line VII-VII in FIGS. 5A to 5D.
Figure 8:
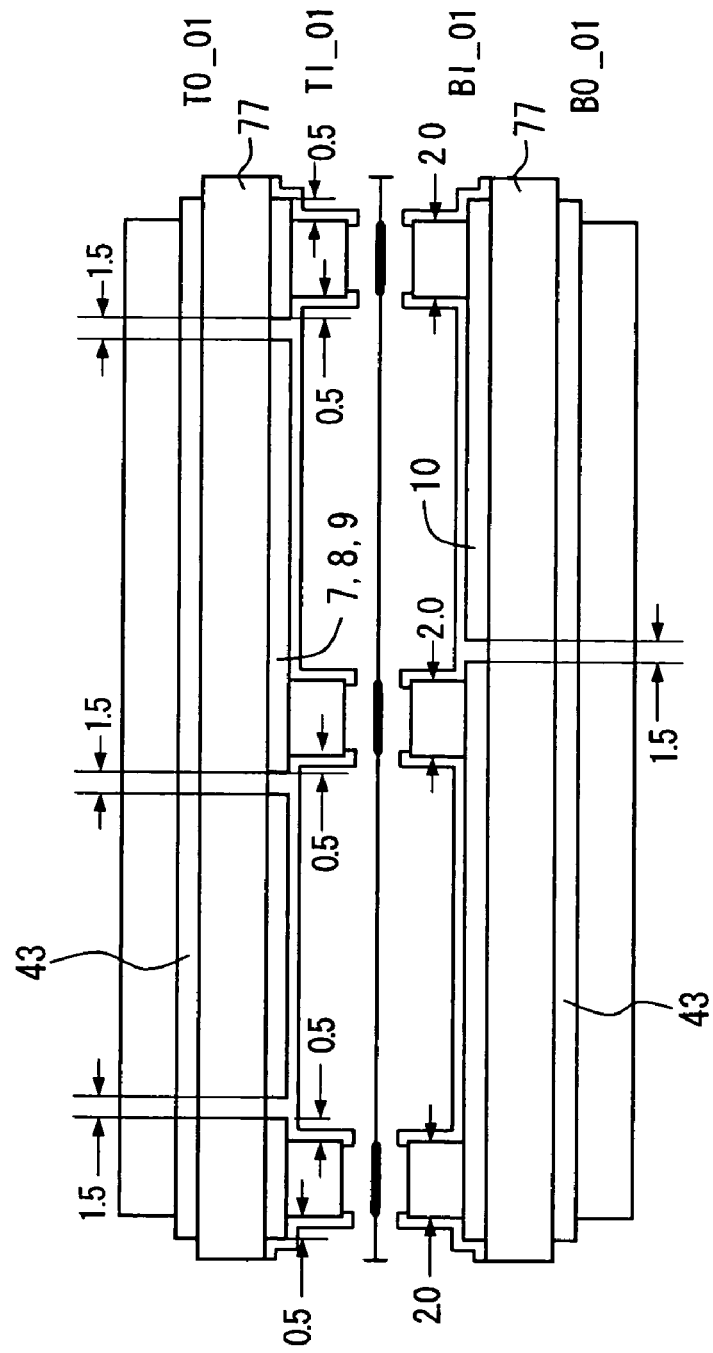
FIG. 8 is a cross-sectional view of the power electronic package taken along line VIII-VIII in FIGS. 5A to 5D.
Figure 38:
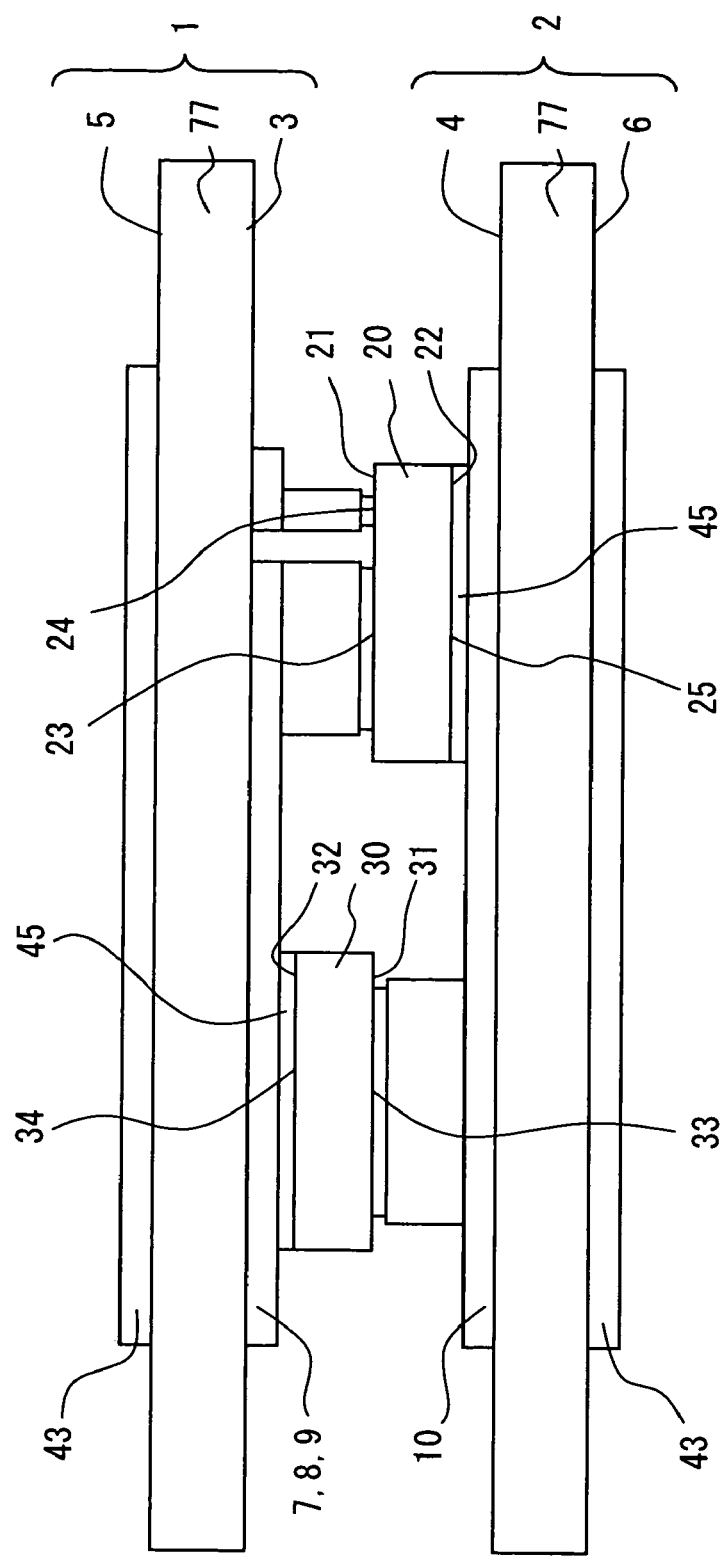
FIG. 38 is a cross-sectional view showing another power electronic package.
Figure 39A:
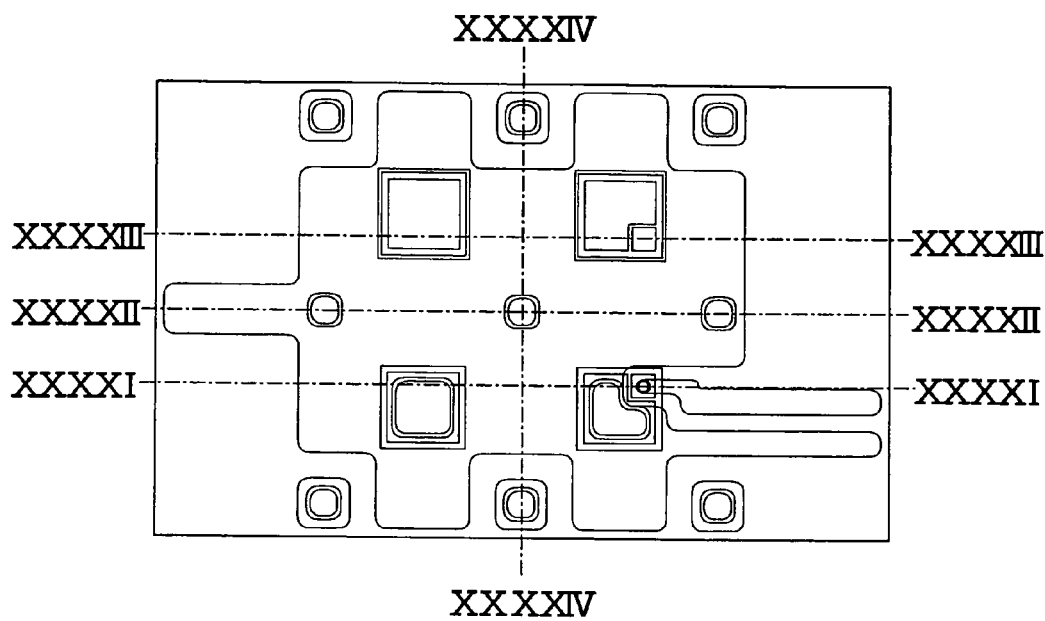
FIGS. 39A and 39B are top and bottom plan views with cut line marks of an upper high thermal conductivity insulating substrate.
Figure 39B:
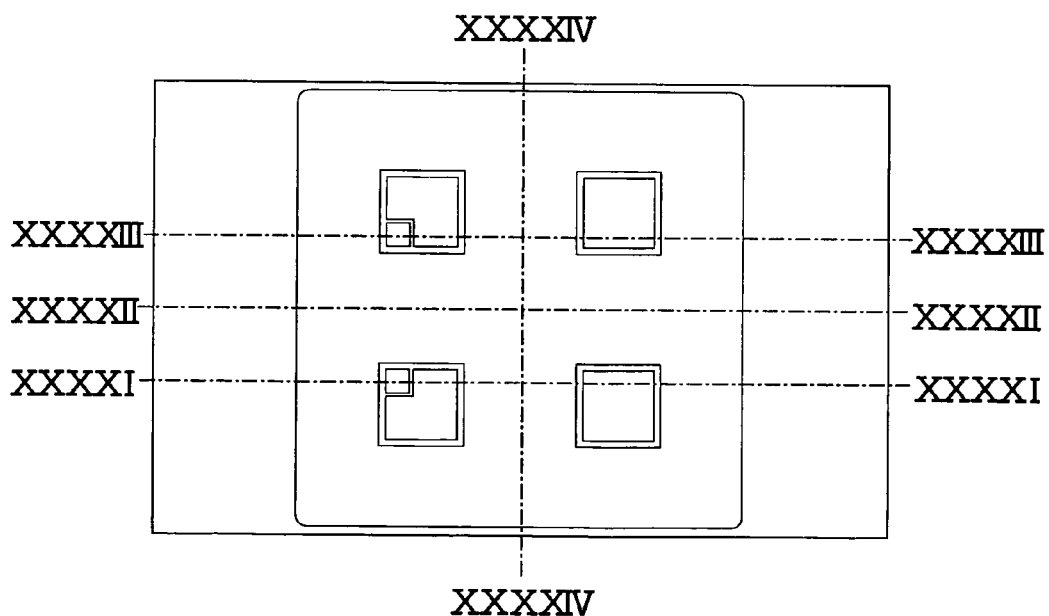
Figure 40A:
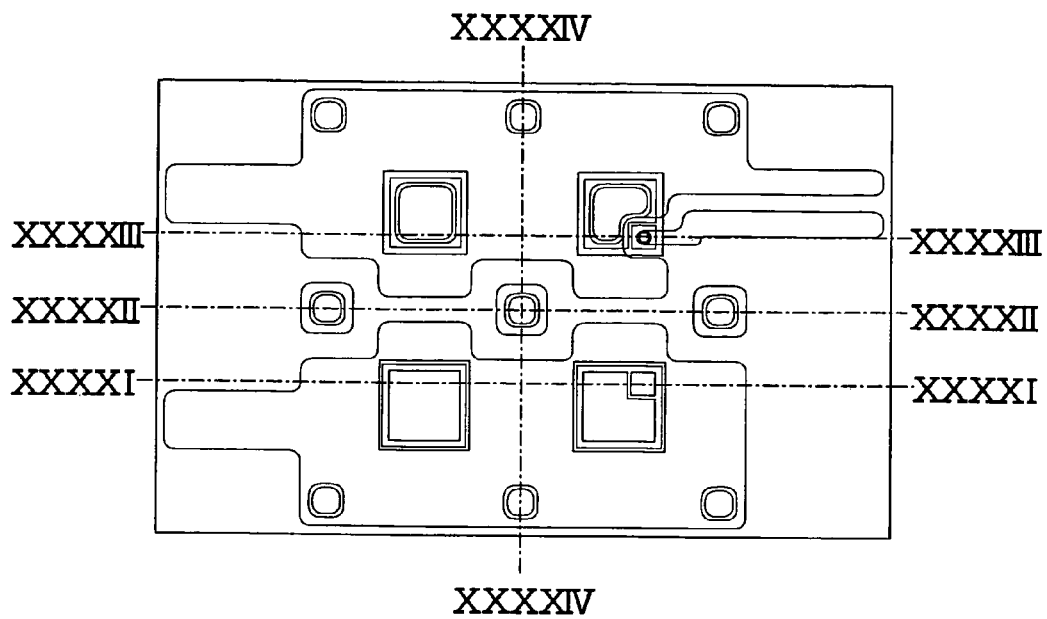
FIGS. 40A and 40B are top and bottom plan views with cut line marks of a lower high thermal conductivity insulating substrate.
Figure 40B:
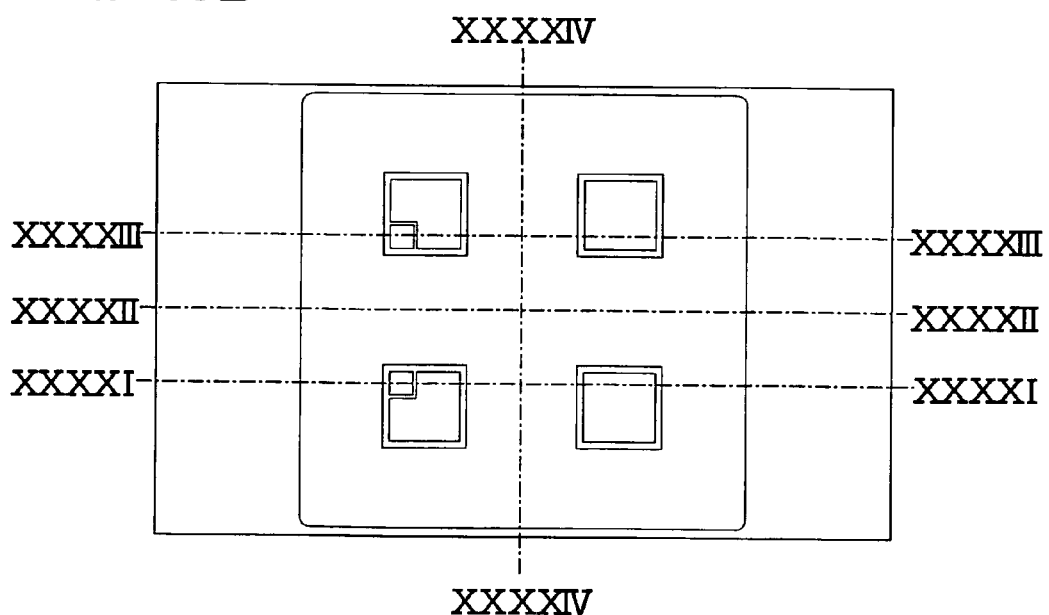
Figure 41:
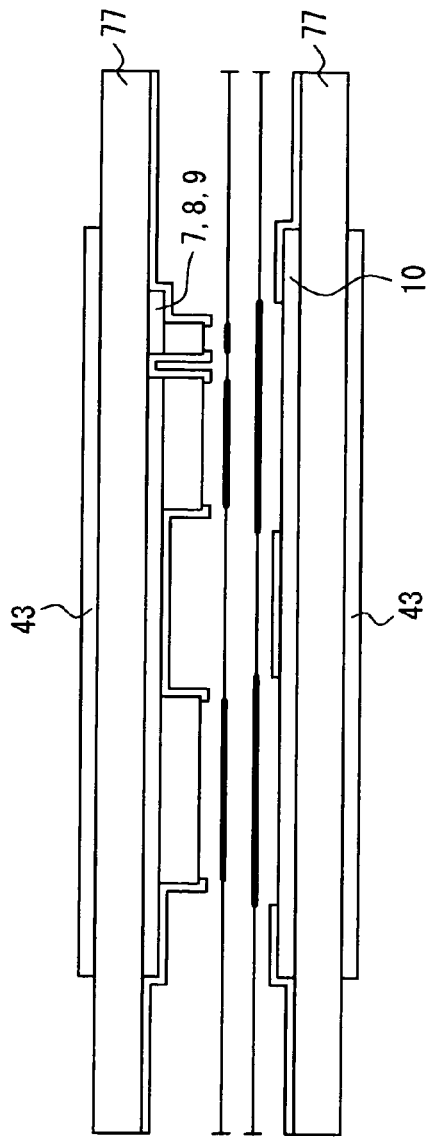
FIG. 41 is a cross-sectional view of the power electronic package taken along line XXXXI-XXXXI in FIGS. 39A to 40B.
Figure 42:
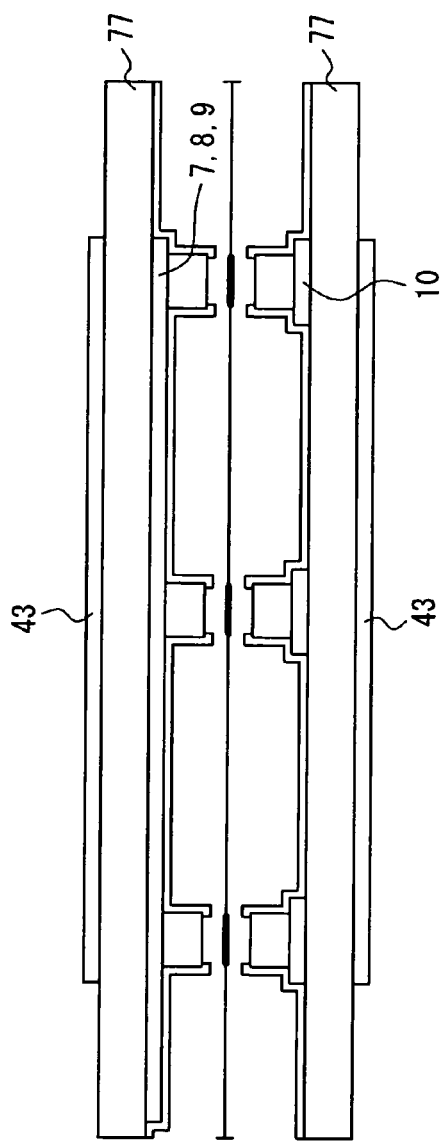
FIG. 42 is a cross-sectional view of the power electronic package taken along line XXXXII-XXXXII in FIGS. 39A to 40B.
Figure 43:
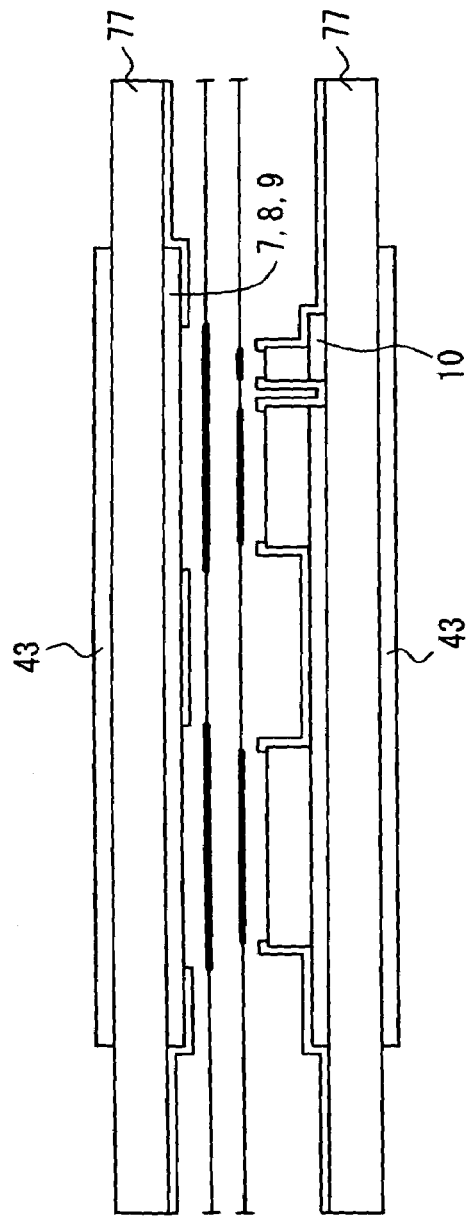
FIG. 43 is a cross-sectional view of the power electronic package taken along line XXXXIII-XXXXIII in FIGS. 39A to 40B.
Figure 44:
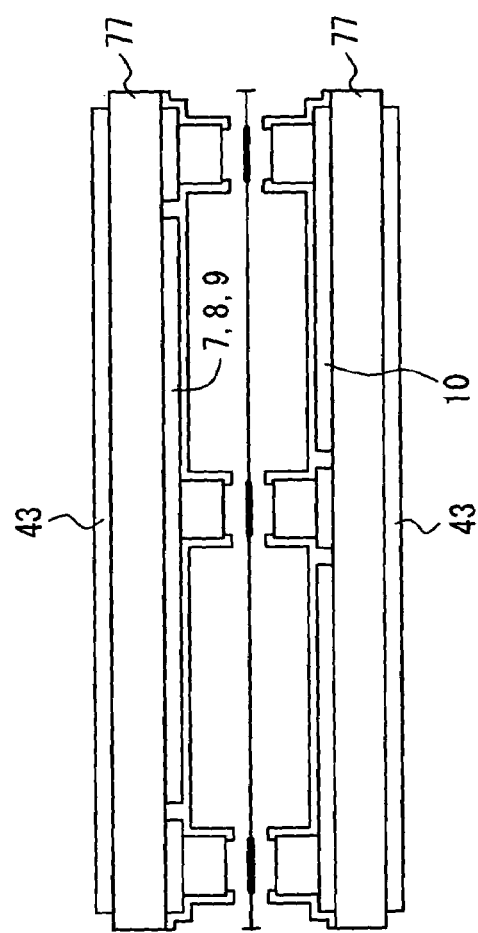
FIG. 44 is a cross-sectional view of the power electronic package taken along line XXXXIV-XXXXIV in FIGS. 39A to 40B.
Figure 45:
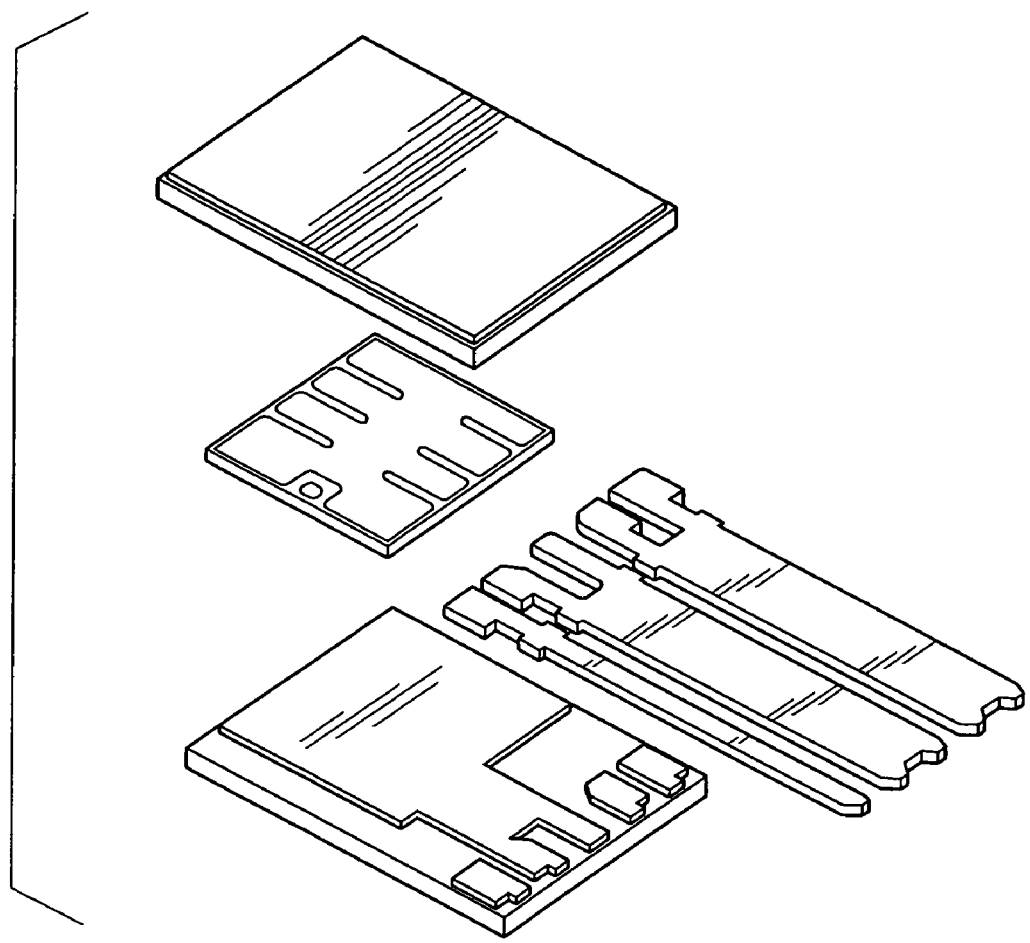
FIG. 45 is an exploded view showing an electrically isolated and thermally conductive double side pre packaged IC component, stamped lead members, contact electrodes, semiconductor chips and the like are positioned between a pair of ceramic substrate members according to a prior art.

In this embodiment, as shown in FIG. 38, the outer surface of the two high thermal conductive insulating non-planar substrates 1, 2 has not been etched for the improved integration with the heat exchanger 80. This embodiment provide a freedom to use a integrated as well as a non integrated heat exchanger 80 for cooling the both side of the sandwich structure. The outer surface of the two high thermal conductive insulating non-planar substrates 1, 2, which is flat at locations other than locations where protrusion walls are located as shown in FIGS. 6-8 for example, is suitable for using closed type micro-channel heat exchanger 80 unit using a thermal component in between to improve the heat radiation performance. However, this leads to a larger thermal resistance of the power electronic package 100, however, this configuration relax the total stress on the sandwich structure due to lack of direct bonding of the heat exchanger 80 unit. This structure can also be mounted on the air-cooled heat exchanger 80 units. The rest of the construction of this embodiment is the same as that of the first embodiment. With this kind of construction also it is possible to improve the thermal heat generation and shear stress distribution within the power electronic package 100.

FIGS. 39A to 40B show the cut line marks on the top plan view of an upper and lower high thermal conductivity insulating substrates according to the fourth embodiment. The cross-sectional views along the lines XXXXI-XXXXI, XXXXII-XXXXII, XXXXIII-XXXXIII and XXXXIV-XXXXIV are shown in the FIGS. 41, 42, 43 and 44, respectively. As shown in these figures, the upper and lower high thermal conductivity insulating non-planar substrates 1, 2 are made up of a substantially rectangular shape, which also includes the external connection buses. First semiconductor transistor 20 and first diode 30 and second semiconductor transistor 20 and second diode chips 30 are soldered on the upper and lower high thermal conductivity insulating non-planar substrates 1, 2, respectively.

The present disclosure relates generally to a power electronic package, in which one or more semiconductor dies and other similarly shaped electronic components are mounted between two high thermal conductivity insulating non-planar substrates. Unique non-planar substrates acts as the connection large area connection post, realizing low electrical and thermal resistances, compare to conventional metal bumps. The mechanical separation of these non-planar substrates is controlled by bonded regions, the number, placement, geometry, composition and method of bonding being chosen to produce a net axially-directed compressive force in the components after assembly. Specifically, the present disclosure is made in light of the foregoing problems, and it is one of objects of the present disclosure to achieve a uniform stress distribution in the power electronic package with pressure type contacts after the full assembly process, which can be reduced in semiconductor chip stresses, and an improved heat radiation performance in a direct double-side cooled configuration. Two high thermal conductivity insulating non-planar substrates are used in the present disclosure to eliminate the wire bonds. The solid copper interconnection posts that replace the wires over the active surface of the semiconductor chips provide not only an excellent electrical path but an excellent thermal cooling path from two principal surfaces of semiconductor chips as well. Such a power electronic package can have a significantly lower semiconductor chip juncture temperature because the thermal cooling structure is connected to the area of the chip where the heat is generated.

Thus, the double-side cooled power electronic package has been proven to be very useful, especially in electronic modules where extended lifetime under extreme high temperature thermal cycles is required. The power electronic package structure does not involve any bond wires from the devices to external pads, thus drastically reducing the number of bonded joints leading to better reliability as well as low parasitic inductances and resistances within the structure.

Specifically, according to a power electronic package of the present disclosure, a semiconductor chip is sandwiched between two high thermal conductivity insulating non-planar substrates, and the electrodes of the semiconductor chip and electrode patterns on the high thermal conductivity insulating non-planar substrates are bonded directly, thereby eliminating the need for wire bonds. The mechanical separation of these non-planar substrates is controlled by bonded regions, the number, placement, geometry, composition and method of bonding being chosen to produce a net axially-directed compressive force in the components after assembly. The heat produced by the semiconductor chip is smoothly transmitted from the two principal surfaces of the semiconductor chip to the two high thermal conductivity insulating non-planar substrates, and is thereby radiated quickly. The direct double-side cooled configuration further reduces the heat resistance of the power electronic package.

According to another aspect of the present disclosure, one or more semiconductor dies and other similarly shaped electronic components of a relatively low coefficient of thermal expansion having two principal surfaces front-rear reversed with respect to each other are mounted between the two high thermal conductivity insulating non-planar substrates. The mechanical separation of these non-planar substrates is controlled by regions of material with a higher thermal expansion coefficient, the number, placement and geometry of the regions being chosen to produce a net axially-directed compressive force in the components after assembly. The assembly temperature of the sandwich is higher than the maximum operating temperature so that a net residual compressive stress will be left in the components upon cooling.

According to another aspect of the present disclosure, one or more semiconductor dies and other similarly shaped electronic components having two principal surfaces front-rear reversed with respect to each other are mounted between the two high thermal conductivity insulating non-planar substrates. The mechanical separation of these non-planar substrates is controlled by bonded regions, the number, placement, geometry, and method of bonding of the regions being chosen to produce a net axially-directed compressive force in the components after assembly. The geometry of the bonded regions is such that the selective application of a compressive force during bonding will leave a net residual compressive stress in the components after bonding.

Furthermore, the high thermal conductivity insulating non-planar substrates are composed of non-conductive ceramic substrate and highly conductive metal, bonded by either direct bonded copper, directly bonded aluminum or active metal brazing solder material. Also, non-conductive ceramic substrate comprise materials taken form the group consisting of alumina, aluminum nitride, silicon nitride, silicon carbide, or diamond, and copper or aluminum metal. In this case, because the coefficient of thermal expansion of non-conductive ceramic substrate is close to that of the semiconductor chip, it is possible to reduce thermal stresses acting between the semiconductor chip and the electrode patterns. Furthermore, the height of the non-bonding region of the high thermal conductivity insulating non-planar substrates is smaller than that of bonded regions so as to provide sufficient gap for encapsulation between the two high thermal conductivity insulating non-planar substrates. An encapsulant comprising of for example silicone rubber is injected into the resulting gap minimize the number of air pockets in the structure, which usually leads to air breakdown when high electric fields are involved. Alternatively, a polyamide film is inserted in the gap to prevent the electrical breakdown.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A power electronic package comprising:
   first and second high thermal conductivity insulating non-planar substrates; and
   a plurality of electronic components mounted on each of the first and second high thermal conductivity insulating non-planar substrates, wherein
   the first and second high thermal conductivity insulating non-planar substrates are coupled to each other at a plurality of bonding regions so that mechanical separation between the first and second high thermal conductivity insulating non-planar substrates is controlled by the number of the bonding regions, an arrangement of the bonding regions, a shape of each bonding region, and a material of the bonding regions,
   the mechanical separation provides a net axially-directed compressive force in the electronic components,
   the bonding regions include electrically inactive bonding regions,
   the mechanical separation of the first and second high thermal conductivity insulating non-planar substrates is controlled by the number of the electrically inactive bonding regions, an arrangement of the electrically inactive bonding regions, and a shape of each inactive bonding region,
   the plurality of electronic components is sandwiched between the first and second high thermal conductivity insulating non-planar substrates so that the net axially-directed compressive force is applied to each electronic component,
   each of the first and second high thermal conductivity insulating non-planar substrates includes a metal layer, which is disposed on the high thermal conductivity insulating non-planar substrate and opposite to the plurality of electronic components,
   the metal layer is made of a material that is the same as a material of the electrically inactive bonding regions,
   each of the bonding regions has the same height from the high thermal conductivity insulating non-planar substrate,
   the number of the electrically inactive bonding regions is equal to or larger than four,
   the electrically inactive bonding regions are arranged symmetrically with respect to a center of the high thermal conductivity insulating non-planar substrate, and
   each of the electrically inactive bonding regions has a planar shape of a square with a rounded corner, the radius of which is equal to or larger than 0.6 mm, or a planar shape of a circle, the radius of which is equal to or greater than 0.6 mm.

2. The package according to claim 1, wherein the bonding regions are arranged in the arrangement in such a manner that a net residual compressive stress in the electronic components is reduced.

3. The package according to claim 1, wherein the mechanical separation of the high thermal conductivity insulating non-planar substrates is controlled by a plurality of regions made of a material having high thermal expansion coefficient so that the net axially-directed compressive force is generated in the electronic components.

4. The package according to claim 1, wherein
   the electronic components include a semiconductor transistor chip,
   the semiconductor transistor chip includes a first main electrode on a first principal surface of the chip and a second main electrode on a second principal surface of the chip, and
   the second principal surface is opposite to the first principal surface.

5. The package according to claim 1, wherein
   the electronic components include a semiconductor diode chip,
   the semiconductor diode chip includes a first main electrode on a first principal surface of the chip and a second main electrode on a second principal surface of the chip, and
   the second principal surface is opposite to the first principal surface.

6. The package according to claim 1, wherein
   each of the first and second high thermal conductivity insulating non-planar substrates is an electrically isolated and thermally conductive step type substrate, and
   the electrically isolated and thermally conductive step type substrate includes first and second exterior surfaces for bonding electrodes of the electronic components and for providing a plurality of external buses for a two-sided electrical connection.

7. The package according to claim 6, wherein
the electrodes of the electronic components include a first main electrode,
the external buses include a first external bus electrode, and
the first external bus electrode connects to the first main electrode.

8. The package according to claim 7, wherein
the electrodes of the electronic components further include a second main electrode,
the external buses further include a second external bus electrode, and
the second external bus electrode connects to the second main electrode.

9. The package according to claim 6, wherein the electronic components are sandwiched between the first exterior surfaces of the first and second high thermal conductivity insulating non-planar substrates.

10. The package according to claim 1, wherein
each of the high thermal conductivity insulating non-planar substrates includes a non-bonding region, and
the non-bonding region has a height, which is small than a height of the bonding regions.

11. The package according to claim 1, wherein the electrically inactive bonding regions are capable of bonding with a solderable electrically conductive material.

12. The package according to claim 6, wherein
the electrodes of the electronic components are capable of bonding the external buses with a solderable electrically conductive material, respectively, and
each external bus is patterned to be an external bus electrode.

13. The package according to claim 12, wherein
the high thermal conductivity insulating non-planar substrates are connected at a sandwich portion through an insulating resin,
the insulating resin is made of epoxy resin or silicone resin,
the insulating resin covers the electronic components and provides electrical isolation between the external bus electrodes.

14. The package according to claim 1, wherein
each high thermal conductivity insulating non-planar substrate includes a non-conductive ceramic substrate and a highly conductive metal member, and
the highly conductive metal members of the high thermal conductivity insulating non-planar substrates are coupled with a direct bonding copper, a direct bonding aluminum or an active metal brazing solder material.

15. The package according to claim 14, wherein the non-conductive ceramic substrate is made of two materials, one of which is alumina, aluminum nitride, silicon nitride, silicon carbide, or diamond, and the other one of which is copper or aluminum.

16. The package according to claim 1, wherein each high thermal conductivity insulating non-planar substrate includes copper or aluminum.

17. The package according to claim 12, wherein
a separate plurality of the electrodes and external busses is disposed on each high thermal conductivity insulating non-planar substrate, and
the plurality of the electrodes and external busses is capable of being formed by a one-bond and two-step etching method with using copper or aluminum.

18. The package according to claim 12, wherein
a separate plurality of the electrodes and external busses is disposed on each high thermal conductivity insulating non-planar substrate, and
the plurality of the electrodes and external busses is capable of being formed by a two-bond and two-step etching method with using copper or aluminum.

19. The package according to claim 1, wherein the electronic components include a vertical type junction field effect transistor.

20. The package according to claim 1, wherein the electronic components include a vertical type metal oxide semiconductor field effect transistor.

21. The package according to claim 1, wherein the electronic components include a vertical type isolated gate bipolar transistor.

22. The package according to claim 1, wherein the electronic components include a vertical type junction diode.

23. The package according to claim 1, wherein the electronic components include a vertical type Schottky barrier diode.

24. The package according to claim 1, wherein the electronic components include a vertical type wide band gap semiconductor transistor and a diode chip.

25. The package according to claim 1, wherein the electronic components include a vertical type silicon carbide transistor and a diode chip.

26. The package according to claim 1, wherein each electronic component is capable of carrying high current density.

27. The package according to claim 1, wherein the package is formed under a process temperature, which is higher than a maximum operating temperature of the package, so that a net residual compressive stress is reduced in the electronic components.

28. The package according to claim 27, wherein the process temperature is about 50 degrees Celsius higher than the maximum operating temperature of the package.

29. The package according to claim 12, wherein the electrodes of the electronic components and the external bus electrodes are bonded with a brazing material, which is made of Au—Sn, Au—Ge, or Au—Si solder.

30. The package according to claim 29, wherein the electrodes of the electronic components and the external bus electrodes are bonded in a single assembly step method with using a transient liquid phase bonding member, which is made of Ag—Sn, or Ag flex.

31. The package according to claim 29, wherein
the electrodes of the electronic components and the external bus electrodes are bonded with a thermo-compressive bonding member, which is made of Au.

32. The package according to claim 1, further comprising:
a direct liquid impingement first heat exchanger unit attached to the first high thermal conductivity insulating non-planar substrate; and
a direct liquid impingement second heat exchanger unit attached to the second high thermal conductivity insulating non-planar substrate, wherein
the heat exchanger units are disposed in parallel to each other.

33. The package according to claim 32, wherein each heat exchanger unit is made of high thermal conductivity copper- or aluminum-silicon carbide.

34. The package according to claim 1, wherein
each of first and second high thermal conductivity insulating non-planar substrates has a rectangular shape,
the bonding regions further include at least one electrically active bonding region, and the one electrically active bonding region is disposed at a center of the rectangular shape.

35. The package according to claim 34, wherein
the electrically inactive bonding regions are disposed on four corners of the rectangular shape, respectively, and
the electrically inactive bonding regions are symmetrically arranged around the center of the rectangular shape.

36. The package according to claim 34, wherein
the electrically inactive bonding regions are disposed on middle portions of four sides of the rectangular shape, respectively, and
the electrically inactive bonding regions are symmetrically arranged around the center of the rectangular shape.

* * * * *